US009698562B2

(12) United States Patent
Watanabe et al.

(10) Patent No.: US 9,698,562 B2
(45) Date of Patent: Jul. 4, 2017

(54) LASER DEVICE

(71) Applicants: Kyoto University, Kyoto-shi, Kyoto (JP); HAMAMATSU PHOTONICS K.K., Hamamatsu-shi, Shizuoka (JP)

(72) Inventors: Akiyoshi Watanabe, Hamamatsu (JP); Kazuyoshi Hirose, Hamamatsu (JP); Yoshitaka Kurosaka, Hamamatsu (JP); Takahiro Sugiyama, Hamamatsu (JP); Susumu Noda, Kyoto (JP)

(73) Assignees: Kyoto University, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/772,459

(22) PCT Filed: Mar. 7, 2014

(86) PCT No.: PCT/JP2014/055994
§ 371 (c)(1),
(2) Date: Sep. 3, 2015

(87) PCT Pub. No.: WO2014/136943
PCT Pub. Date: Sep. 12, 2014

(65) Prior Publication Data
US 2016/0020576 A1    Jan. 21, 2016

(30) Foreign Application Priority Data

Mar. 8, 2013 (JP) .................................. 2013-047125

(51) Int. Cl.
*G02F 1/35* (2006.01)
*H01S 5/00* (2006.01)
(Continued)

(52) U.S. Cl.
CPC .......... *H01S 5/0092* (2013.01); *G02F 1/3544* (2013.01); *G02F 1/3551* (2013.01);
(Continued)

(58) Field of Classification Search
None
See application file for complete search history.

(56) References Cited

U.S. PATENT DOCUMENTS 6,859,304 B2 * 2/2005 Miller .................... B82Y 20/00
250/214.1
2009/0168829 A1 7/2009 Kise et al.
2010/0238966 A1 9/2010 Mochizuki

FOREIGN PATENT DOCUMENTS

CN    102201648    9/2011
CN    102696114    9/2012
(Continued)

OTHER PUBLICATIONS

A. Watanabe et al., "Photonic crystal-surface-emitting lasers as a pumping light source for second harmonic generation", Proc. of SPIE, vol. 9002, 2014, p. 90020Z-1-p. 90020Z-6.
(Continued)

*Primary Examiner* — Hemang Sanghavi
(74) *Attorney, Agent, or Firm* — Drinker Biddle & Reath LLP

(57) ABSTRACT

In a laser device, a different refractive index region 6B of a photonic crystal layer is arranged at a lattice point position of a square lattice. In the case where a plane shape of the different refractive index regions 6B is a nearly isosceles right triangle, two sides forming a right angle extend along longitudinal and horizontal lateral lines of the square lattice. A direction parallel to or vertical to an oblique side of the
(Continued)

triangle and a direction of polarization in the periodic polarization inversion structure of a nonlinear optical crystal NL are the same.

7 Claims, 21 Drawing Sheets

(51) Int. Cl.
*H01S 5/18* (2006.01)
*H01S 5/022* (2006.01)
*H01S 5/10* (2006.01)
*G02F 1/37* (2006.01)
*G02F 1/355* (2006.01)
*H01S 5/024* (2006.01)
*H01S 5/187* (2006.01)

(52) U.S. Cl.
CPC .............. *G02F 1/3558* (2013.01); *G02F 1/37* (2013.01); *H01S 5/02248* (2013.01); *H01S 5/105* (2013.01); *H01S 5/18* (2013.01); *G02F 2001/3548* (2013.01); *H01S 5/02446* (2013.01); *H01S 5/187* (2013.01)

(56) References Cited

FOREIGN PATENT DOCUMENTS

| JP | H06-347848 A | 12/1994 |
|---|---|---|
| JP | 2003-273460 A | 9/2003 |
| JP | 2008-060306 A | 3/2008 |
| JP | 2010-219307 A | 9/2010 |

OTHER PUBLICATIONS

A. Watanabe et al., "SHG Using PCSEL Device as Light Source", The 60th JSAP Spring Meeting Koen Yokosyu, vol. 60, 28p-C1-20, Mar. 11, 2013.

International Preliminary Report on Patentability dated Sep. 17, 2015 for PCT/JP2014/055994.

* cited by examiner

Fig. 5

| | MATERIAL | CONDUCTIVE TYPE | THICKNESS (nm) |
|---|---|---|---|
| CONTACT LAYER 8 | GaAs | P | 50~500 (200) |
| UPPER CLADDING LAYER 7 | AlGaAs | P | 1×10³~3×10³ (2×10³) |
| PHOTONIC CRYSTAL LAYER 6 (REFRACTIVE INDEX MODULATION LAYER) | BASE LAYER 6A: GaAs BURIED LAYER 6B: AlGaAs | — | 50~200 (100) |
| UPPER LIGHT GUIDE LAYER 5 | UPPER LAYER: GaAs | — | 10~200 (50) |
| | LOWER LAYER: AlGaAs | — | 10~100 (50) |
| UPPER LIGHT GUIDE LAYER 4 | MQW: AlGaAs/InGaAs | — | 10~100 (30) |
| LOWER LIGHT GUIDE LAYER 3 | AlGaAs | — | 0~300 (150) |
| LOWER CLADDING LAYER 2 | AlGaAs | N | 1×10³~3×10³ (2×10³) |
| SEMICONDUCTOR SUBSTRATE 1 | GaAs | N | 80×10³~350×10³ (150×10³) |

Fig.8
(A)
Mode A
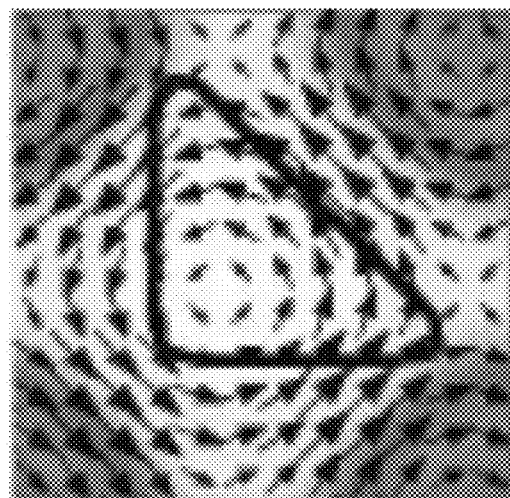
(B)
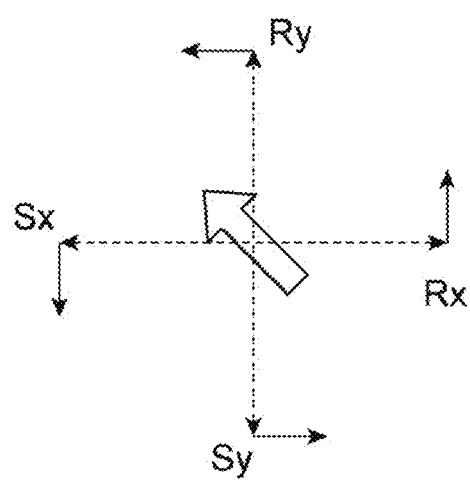

*Fig.9*
(A)
Mode B
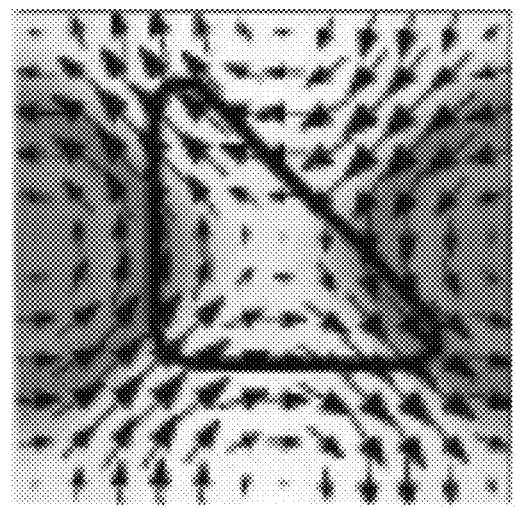
(B)
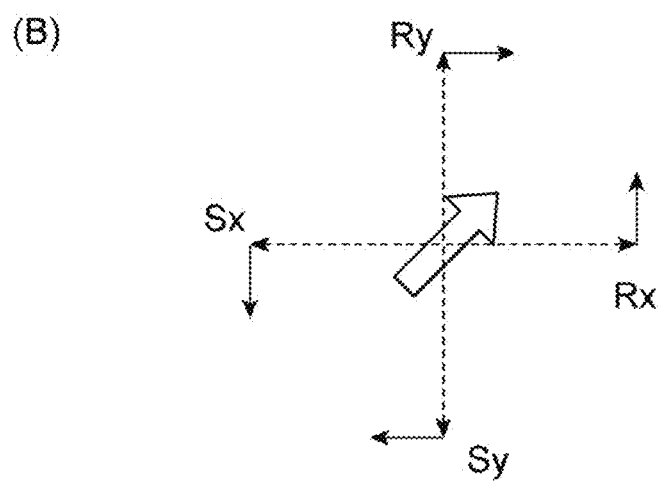

Fig.19
(A)
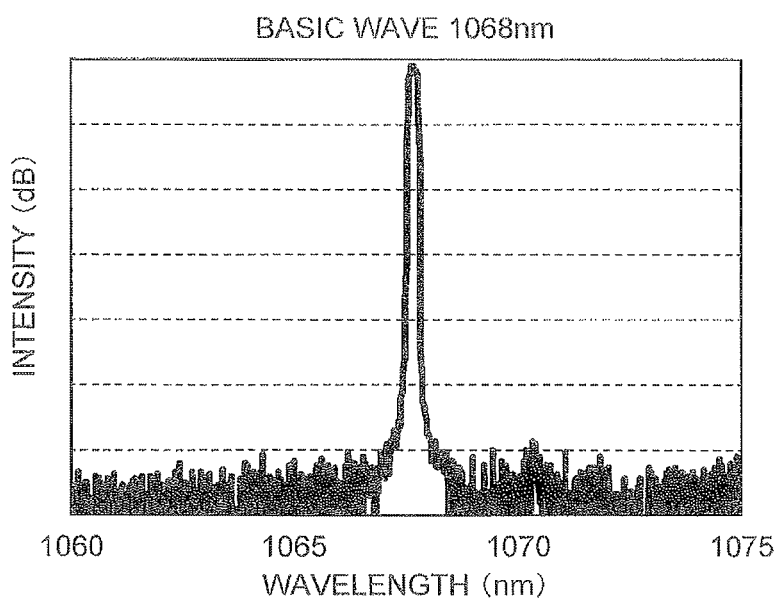
(B)
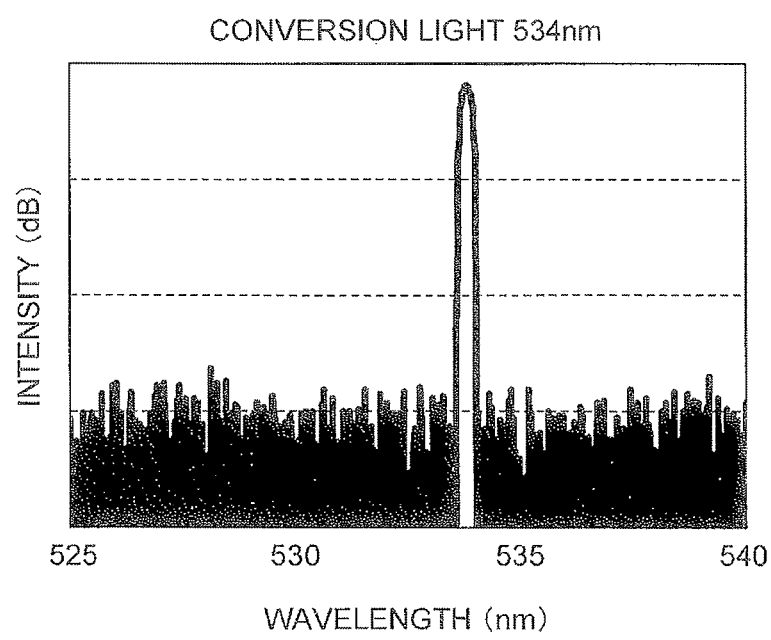

Fig.21
(A)
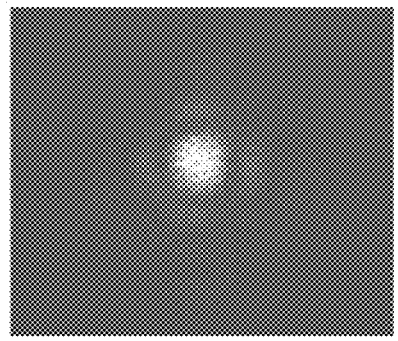
(B)
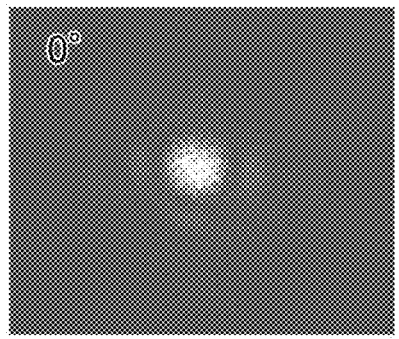
(C)
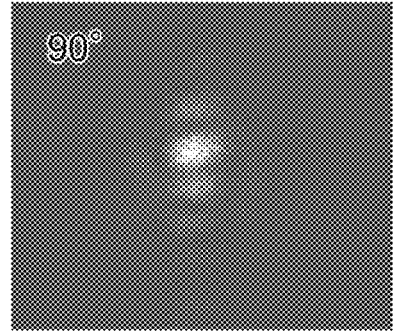

LASER DEVICE

TECHNICAL FIELD

The present invention relates to a laser device using a photonic crystal surface emitting laser element.

BACKGROUND ART

Conventionally, when a laser beam is incident on a nonlinear optical crystal, the laser beam in which a wavelength has been converted by a nonlinear optical effect is emitted. In the case where a difference between a phase of a laser beam generated at a reference position and a phase of a laser beam generated at a position separated from the reference position, by a coherent length becomes π by phase conversion by a nonlinear optical crystal, the laser beams are mutually offset, and intensity thereof is decreased. A quasi phase matching (QPM) technique using a nonlinear optical crystal having a periodic polarization inversion structure is known to suppress the decrease in laser beam intensity. By this technique, a polarization inversion period is set so that a length in a light propagation direction in a positive or negative polarization region becomes a coherence length (length in which the phase is deviated by π).

Patent Literature 1 discloses a laser device which generates a laser beam by combining a nonlinear optical crystal and a semiconductor laser element, which does not resonate in an element thereof, and entirely resonating them.

CITATION LIST

Patent Literature

Patent Literature 1 JP 2010-219307 A

SUMMARY OF INVENTION

Technical Problem

However, it is considered in the laser device illustrated in FIG. 7 in PTL 1 that naturally emitted light generated from a quantum well layer of a light emitting unit travel in a vertical direction by diffraction of a photonic crystal, and rarely reach an external mirror. Therefore, a very large current needs to be injected to cause external oscillation, and efficiency is lowered. Accordingly, an output of a wavelength conversion light is probably not sufficient. Also, an incident phase to a photonic crystal of a laser beam returned from an external minor needs to be equal to an emission phase to obtain stable oscillation. However, a distance between a light emitting unit and an external mirror is much longer than a laser wavelength, and a space oscillation mode and a polarization mode are likely to be disturbed, and therefore a beam shape of the obtained wavelength conversion light becomes unstable.

The present invention, in view of the above-described issue, has an object to provide a laser device capable of remarkably improving intensity of a wavelength conversion light and stably obtaining a beam. pattern having a Gaussian distribution spot shape.

Solution to Problem

A laser element oscillates by itself in the laser device. Therefore, in comparison with an external resonator type laser, a threshold of an injection current causing oscillation is low, and oscillation efficiency can be increased. Also, since a photonic crystal structure provided in the element directly acts on an oscillation mode during laser oscillation, a beam shape and polarization characteristics become stable and can be easily controlled. In this manner, a wavelength conversion light with excellent beam quality and high light intensity can be obtained by making a laser beam having high light output efficiency, stable beam shape, and polarization characteristics incident on a wavelength conversion element. Also, in the device, a laser element itself emits a beam having a Gaussian distribution spot shape.

To solve the above-described issue, a first laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a square lattice set on a main surface of the photonic crystal layer. A plane shape of each of the different refractive index regions is set to a nearly isosceles right triangle. Two sides forming a right angle of the nearly isosceles right triangle extends along a longitudinal lattice line and a horizontal lattice line forming the square lattice. A direction parallel to or vertical to an oblique side of the nearly isosceles right triangle and a direction of polarization in the periodic polarization inversion structure are the same.

The plane shape of a specified different refractive index region does not become a shape mathematically strictly specified in actual manufacturing. Angles thereof are rounded, and each side might be slightly distorted, "Nearly" means that a specified shape may be slightly deformed as described above during manufacturing.

In the first laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a square lattice. Also, in the case where the above condition is satisfied, a wavelength conversion light emitted from the nonlinear optical crystal has a beam pattern having a Gaussian distribution spot shape, and light intensity thereof is remarkably increased.

A second laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a square lattice set on a main surface of the photonic crystal layer. A plane shape of each of the different refractive index regions is set to a nearly equilateral triangle. A vertical line extending to a base from one of apexes of the nearly equilateral triangle extends along a longitudinal lattice line forming the square lattice. A direction of the base of the nearly equilateral triangle and a direction of polarization in the periodic polarization inversion structure are the same.

In the second laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a square lattice. Also, in the case where the above condition is satisfied, a wavelength conversion light emitted from the nonlinear optical crystal has a beam pattern having a Gaussian distribution spot shape, and light intensity thereof is remarkably increased.

A third laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a square lattice set on a main surface of the photonic crystal layer. A plane shape of each of the different refractive index regions is set to a nearly rectangular trapezoid. Two sides forming one of right angles of the nearly rectangular trapezoid extend along a longitudinal lattice line and a horizontal lattice line forming the square lattice. A direction of a lower bottom of the nearly rectangular trapezoid or a direction forming an angle of 45° to the lower bottom and a direction of polarization in the periodic polarization inversion structure are the same.

In the third laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a square lattice. Also, in the case where the above condition is satisfied, a wavelength conversion light emitted from the nonlinear optical crystal has a beam pattern having a Gaussian distribution spot shape, and light intensity thereof is remarkably increased.

A fourth laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a triangle lattice set on a main surface of the photonic crystal layer. A plane shape of each of the different refractive index regions is set to a nearly isosceles right triangle. A polarization direction of the laser element and a direction of polarization in the periodic polarization inversion structure are the same.

In the fourth laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a triangle lattice. Also, in the case where the above condition is satisfied, a wavelength conversion light emitted from the nonlinear optical crystal has a beam pattern having a Gaussian distribution spot shape, and light intensity remarkably increases.

A fifth laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a triangle lattice set on a main surface of the photonic crystal layer. A plane shape of each of the different refractive index regions is set to a nearly square. A polarization direction of the laser element and a direction of polarization in the periodic polarization inversion structure are the same.

In the fifth laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a triangle lattice. Also, in the case where the above condition is satisfied, a wavelength conversion light emitted from the nonlinear optical crystal has a beam pattern having a Gaussian distribution spot shape, and light intensity remarkably increases.

A sixth laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a triangle lattice set on a main surface of the photonic crystal layer. A plane shape of each of the different refractive index regions is set to a nearly oval of which flattening is larger than 0. A polarization direction of the laser element and a direction of polarization in the periodic polarization inversion structure are the same.

In the sixth laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a triangle lattice. Also, in the case where the above condition is satisfied, a wavelength conversion light emitted from the nonlinear optical crystal has a beam pattern having a Gaussian distribution spot shape, and light intensity remarkably increases.

A seventh laser device includes a nonlinear optical crystal having a periodic polarization inversion structure in which a laser beam emitted from a photonic crystal surface emitting laser element is made incident. The photonic crystal surface emitting laser element includes an active layer, upper and lower cladding layers sandwiching the active layer, and a photonic crystal layer provided between the upper or lower cladding layer and the active layer. The photonic crystal layer includes a base layer including a first refractive index medium, and multiple different refractive index regions including a second refractive index medium having a refractive index different from that of the first refractive index medium and arranged in the basic layer. The multiple different refractive index regions are arranged at a lattice point position in a triangle lattice set on a main surface of the photonic crystal layer. A plane shape of each of the different refractive index regions is set to a nearly rectangular trapezoid. A polarization direction of the laser element and a direction of polarization in the periodic polarization inversion structure are the same.

In the seventh laser device, when a laser beam emitted from a photonic crystal surface emitting laser element is incident on a nonlinear optical crystal having a periodic polarization inversion structure, a wavelength of the a laser beam is converted by the nonlinear optical crystal, and the a laser beam is emitted from the nonlinear optical crystal. Herein, a different refractive index region in a photonic crystal layer is arranged at a lattice point position of a triangle lattice. Also, in the case where the above condition is satisfied, a wavelength conversion light emitted from the nonlinear optical crystal has a beam pattern having a Gaussian distribution spot shape, and light intensity remarkably increases.

Advantageous Effects of Invention

According to the laser device, a laser beam in which a wavelength has been converted has a Gaussian distribution spot shape beam pattern, and light intensity thereof can be remarkably improved.

BRIEF DESCRIPTION OF DRAWINGS

FIG. 5 is a diagram illustrating component materials, conduction types, and thicknesses of laser elements.

FIG. 8 are a view (A) illustrating an electromagnetic field on a two-dimensional plane of the photonic crystal layer in the laser element and a diagram (B) illustrating a polarization direction in the two-dimensional plane of the photonic crystal layer.

FIG. 9 are a view (A) illustrating an electromagnetic field on a two-dimensional plane of the photonic crystal layer in the laser element and a diagram (B) illustrating a polarization direction in the two-dimensional plane of the photonic crystal layer.

FIG. 19 are graphs illustrating the relation between wavelength and intensity.

FIG. 21 are photos illustrating polarization state of a laser beam.

DESCRIPTION OF EMBODIMENTS

Hereinafter, a laser device according to an embodiment will be described. The same signs are used for the same elements, and a duplicated description will be omitted.

Figure 1:
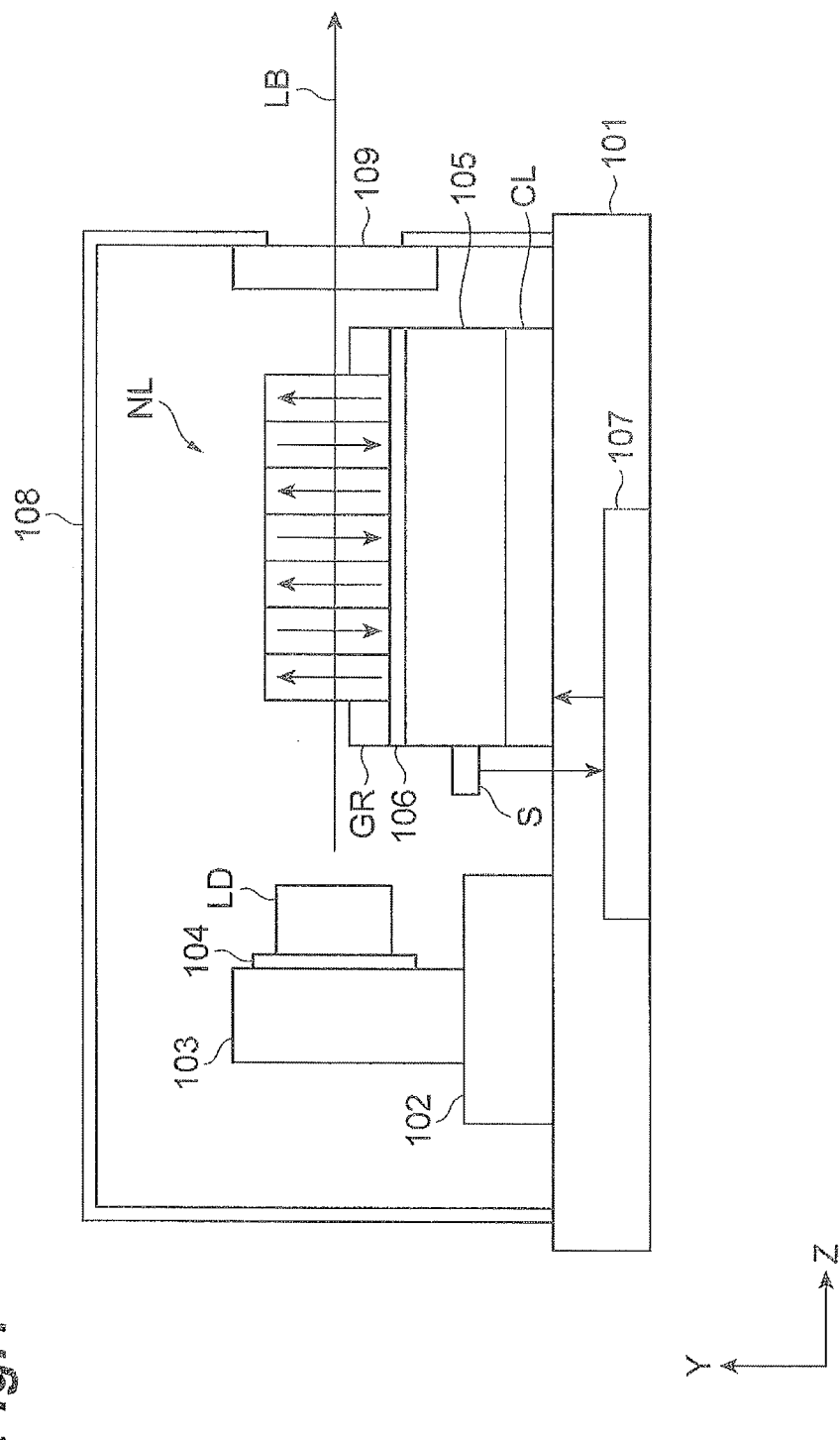
FIG. 1 is a view illustrating a longitudinal section structure of a laser device.

FIG. 1 is a view illustrating a longitudinal section structure of a laser device.

A mount substrate 102 is fixed on a first region of a support substrate 101, and a support member 103 of a laser element LD is fixed on the mount substrate 102. The laser element LD is a photonic crystal surface emitting laser element and emits a laser beam LB in a Z axis direction. The laser element LD is fixed to a side surface of the support member 103 via a conductive adhesive 104. The adhesive 104 includes solder or gold, and a lower surface of the laser element LD is connected to a fixed potential. Positive/negative electrodes (not illustrated) for applying bias voltage to the laser element are patterned on a surface of the support member 103, and one electrode is electrically connected to a lower surface of the laser element LD by the adhesive 104, and another electrode is electrically connected to an upper surface of the laser element LD by using such as wire bonding (not illustrated).

A temperature control device CL is fixed on a second region of the support substrate 101. A heat sink 105 including copper is fixed on the temperature control device CL. The temperature control device CL includes a Peltier element. A nonlinear optical crystal NL is fixed on the heat sink 105 via an adhesive 106. Although the adhesive 106 can be a conductive adhesive such as highly heat conductive solder and gold, an insulating adhesive such as resin may be used. A V-groove GR is formed on a surface of the heat sink 105, and two side surfaces adjacent to the nonlinear optical crystal NL having a quadrangular cylindrical shape are fixed to an inner surface of the V-groove GR via the adhesive 106. The nonlinear optical crystal NL has a periodic polarization inversion structure having a quasi phase matching (QPM) structure.

A drive circuit 107 for supplying current to the temperature control device CL is provided to the support substrate 101. The drive circuit 107 may be incorporated into the support substrate 101, may be attached on a surface of the support substrate 101, and also may be arranged at a position separated from the support substrate 101. In the case where the drive circuit 107 is incorporated into the support substrate 101, for example, the drive circuit 107 may be arranged in a recessed portion by forming the recessed portion on a lower surface of the support substrate 101. A sensor S for directly or indirectly measuring a temperature of the nonlinear optical crystal NL is provided to the heat sink 105. This sensor S is preferably a temperature sensor for measuring a temperature of the heat sink 105. Output from the sensor S is input to the drive circuit 107. The drive circuit 107 feedback-controls drive power to be supplied to the temperature control device CL based on data input from the sensor S. Specifically, in the case where output from the sensor S is larger than a setting value, the drive power is decreased, and in the case where the output from the sensor S is smaller than the setting value, the drive power is increased.

The sensor S directly or indirectly measures a temperature of the nonlinear optical crystal NL. Therefore, the sensor S may be directly attached to the nonlinear optical crystal NL. Although the sensor S can include a thermocouple, a radiation thermometer may be included. In the case where the radiation thermometer is included, for example, infrared light or visible light emitted from the nonlinear optical crystal NL is measured. Photodiode including a filter for blocking a laser beam wavelength can be included in the radiation thermometer.

As an intensity monitor of the laser beam LB, the sensor S may be configured by a look-up table method in which a temperature of the nonlinear optical crystal NL corresponding to the measured intensity is read out from the table. Specifically, a temperature can be measured by the look-up table method if correlation data of intensity and/or wavelength of the laser beam LB output from the laser device and a temperature of the nonlinear optical crystal NL is preliminary obtained and stored in a storage device.

A cover 108 for storing the above elements is attached on the support substrate 101. A light emitting window 109 for emitting the laser beam LB is provided on a side surface of the cover 108. The cover 108 seals an inner space with the support substrate 101 and suppresses effects from the outside such as outer temperature/humidity and dust. A laser beam emitted from the laser element LD travels along a Z axis positive direction and is wavelength-converted through the nonlinear optical crystal NL. The wavelength-converted laser beam LB is output to the outside from the light emitting window 109. The drive circuit 107 of the temperature control device CL which is a cooling device may include a drive circuit of the laser element LD.

A heat sink including copper can be used in the support substrate 101. In this case, the mount substrate 102, the support member 103, and the laser element LD are also cooled. In the case where a lower surface of the laser element LD is electrically connected to the support substrate 101 via a conductor such as a wiring, the support substrate 101 can cool the laser element LD via the wiring.

Figure 2:
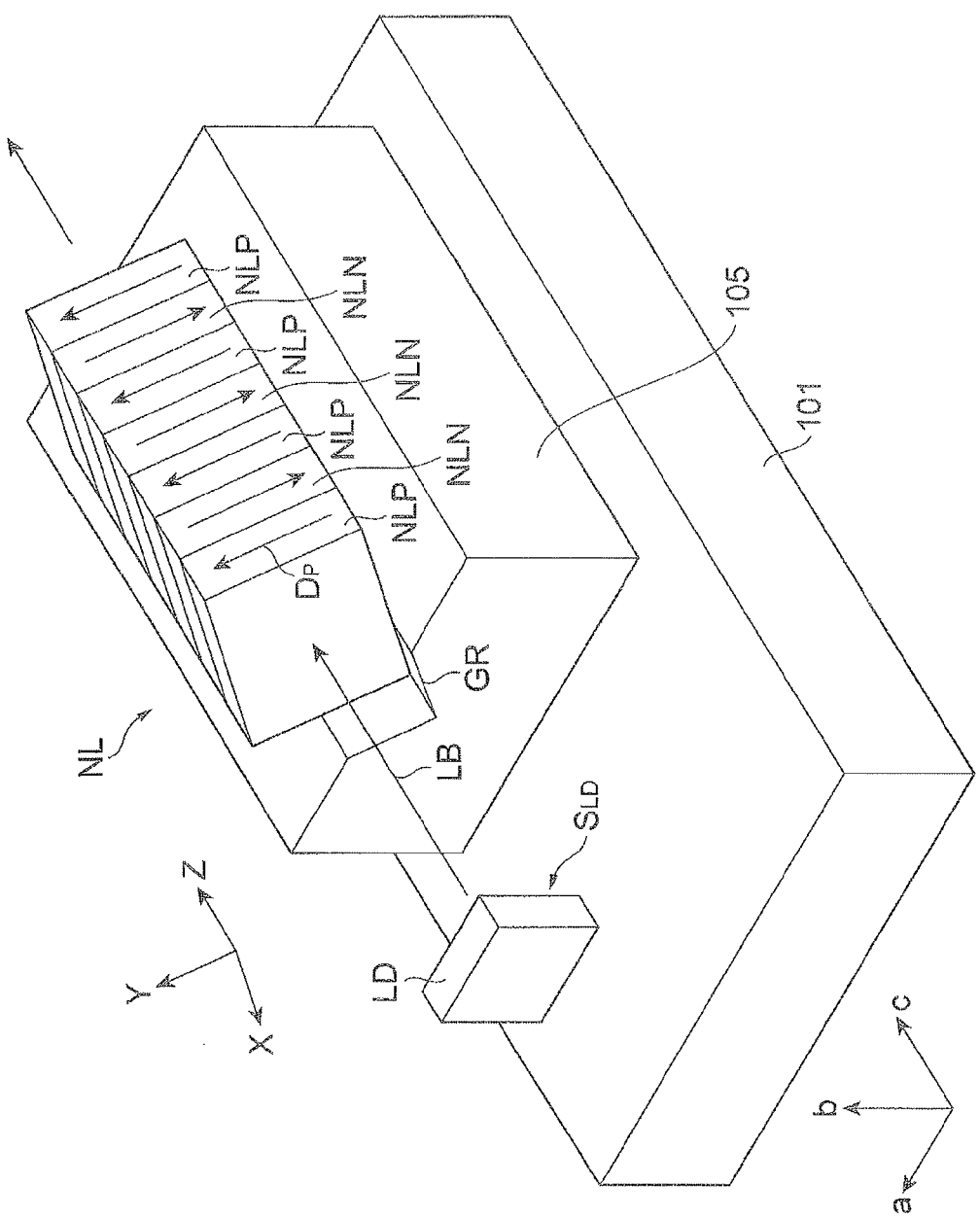
FIG. 2 is a perspective view illustrating an internal structure of the laser device.

FIG. 2 is a perspective view illustrating an internal structure of the laser device.

The laser beam LB emitted from a light emitting surface $S_{LD}$ of the laser element LD travels in a Z axis direction and is made incident on the nonlinear optical crystal NL having a light incident surface vertical to the Z axis. The nonlinear optical crystal NL has a periodic polarization inversion structure of a quasi phase matching (QPM) structure, and a positive polarization region NLP and a negative polarization region NLN are alternatively laminated along the Z axis direction in the nonlinear optical crystal NL. A polarization inversion period is set so that the length of a light propagation direction (Z axis direction) of each polarization region becomes a coherent length (length in which a phase of the propagating laser beam LB is deviated by $\pi$). A direction of polarization $D_P$ in each polarization region is switched by alternatively inversing along a traveling direction of the laser beam LB as illustrated in the figure.

To clarify a description, a main surface of the support substrate 101 (a surface mounting an element) is assumed to be an ac surface, and an axis perpendicular to both of an a axis and a c axis is assumed to be a b axis. Then, an abc orthogonal coordinate system is set. The Z axis and the c axis are coincident, and a coordinate system obtained by rotating the abc orthogonal coordinate system around the c axis is an XYZ orthogonal coordinate system. A rotating angle around the c axis from the b axis to Y axis is assumed to be $\theta$.

The nonlinear optical crystal NL is a rectangular parallelepiped in which the Z axis direction is a longitudinal direction. A light incident surface of the laser beam LB is assumed to be an XY plane. Four surfaces surrounding the light incident surface has a shape formed by either of an XZ surface or a YZ surface. The light emitting surface $S_{LD}$ of the laser element LD having a rectangular parallelepiped shape is an ab surface (XY surface). A side surface perpendicular to the light emitting surface is an ac surface. Specifically, an XYZ orthogonal coordinate system is a coordinate system set in accordance with a direction of the nonlinear optical crystal NL, and the abc orthogonal coordinate system is a coordinate system. set in accordance with the laser element LD.

Figure 3:
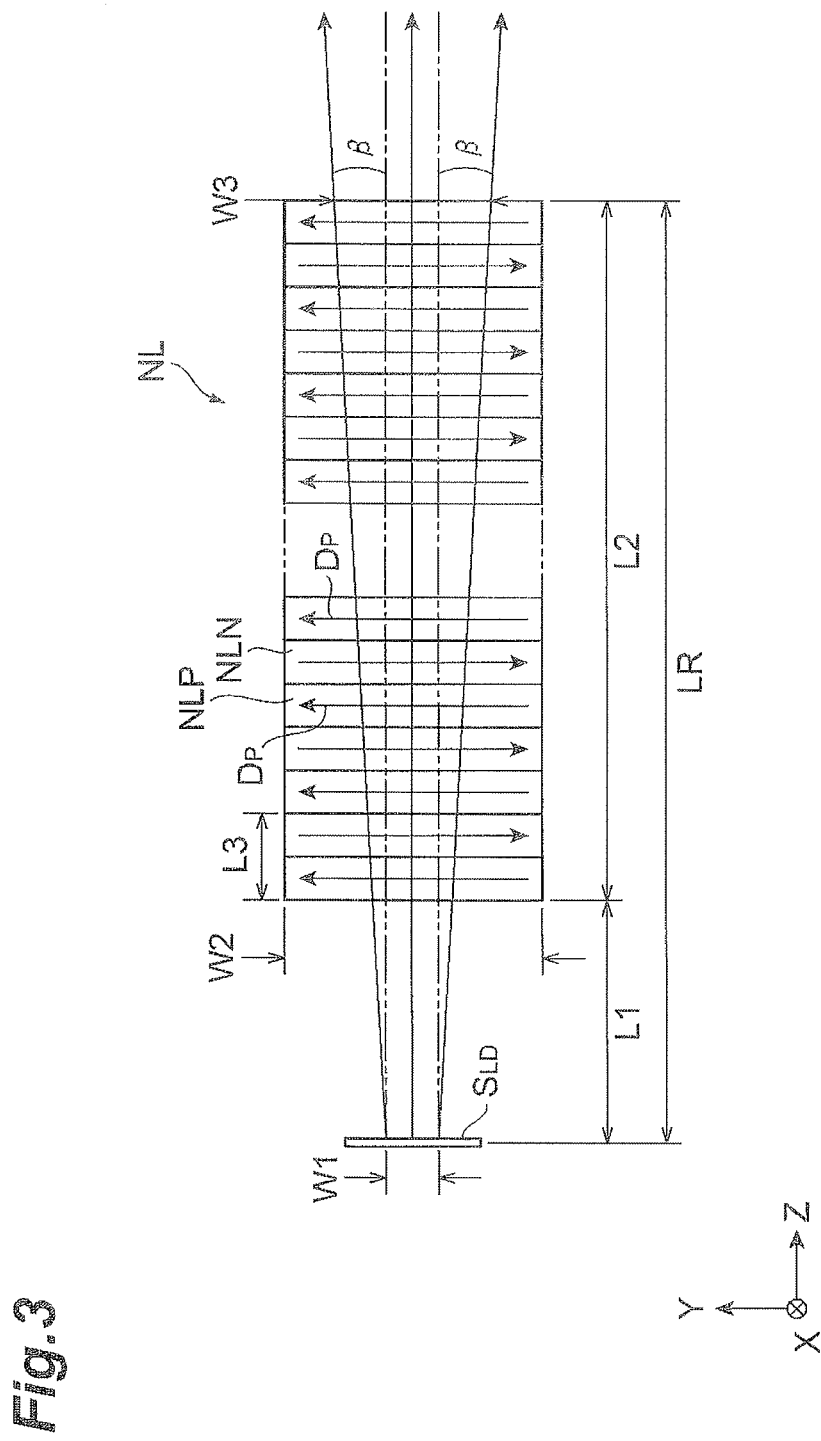
FIG. 3 is a view illustrating a nonlinear optical crystal in the laser device.

FIG. 3 is a view illustrating a nonlinear optical crystal in the laser device.

A distance from the light emitting surface $S_{LD}$ of the laser beam LB to the light incident surface of the nonlinear optical crystal NL is assumed as L1, a distance from a light incident surface to a light emitting surface of the nonlinear optical crystal NL is assumed as L2, and the overall distance is assumed as $L_R$. Also, a length along the Z axis of a pair of the positive polarization region NLP and the negative polarization region NLN is assumed as L3. In the QPM structure, with respect to a wavelength λ of a basic wave of the laser beam LB emitted from a laser element, a refractive index $n_\omega$ with respect to the basic wave, a refractive index $n_{2\omega}$ with respect to a second high-harmonic emitted from the nonlinear optical crystal NL, and a degree m (generally 1) are set to a polarization inversion period L3=mλ/(2($n_{2\omega}$−$n_\omega$)).

As a ferroelectric crystal forming each polarization region, a periodic polarization inversion structure can be formed by using $LiNbO_3$ including an appropriate additive such as Mg, and $LiTaO_3$ including an appropriate additive such as Mg.

A diameter of the laser beam LB on the light emitting surface $S_{LD}$ of a laser element (Y axis direction length) is assumed as W1, a Y axis direction length of the nonlinear optical crystal NL is assumed as W2, and a diameter (Y axis direction length) of the laser beam LB on the light emitting surface of the nonlinear optical crystal NL is assumed as W3. A spreading angle of the laser beam LB emitted from the light emitting surface $S_{LD}$ is assumed to be 2×β. β is an angle formed by a normal line with respect to a light emitting surface of the nonlinear optical crystal NL and a ray on the outermost side of the laser beam LB. β has the following relation: (2β=2arctan{(W3−W1)/2LR}).

Also, a laser element satisfies the formula, 2β=1.22×λ/W1(rad), while emitting diffraction. limited light, and in the case where β is small, the formula becomes W3=W1+(2×β×(LR+L1)) by a paraxial approximation calculation. So that a laser beam is within the nonlinear optical crystal NL, W3 needs to be smaller than W2. For example, the formulae, β=3.05×$10^{-3}$rad, W3=0.2+6.1×$10^{×3}$×(LR+L1)(mm), are satisfied in the case of W3=200 μm and λ=1 μm. In trial production, (LR+L1) is equal to 40 mm, therefore W3 is equal to 0.0.444 mm. A size of the nonlinear optical crystal NL W2 is equal to 0.5 mm, the formula, W3<W2, is satisfied in this optical system.

As described above, the above-described laser device includes the nonlinear optical crystal NL having a periodic polarization inversion structure in which the laser beam LB emitted from the photonic crystal surface emitting laser element LD is made incident. Next, a detailed structure of the photonic crystal surface emitting laser element LD will be described.

Figure 4:
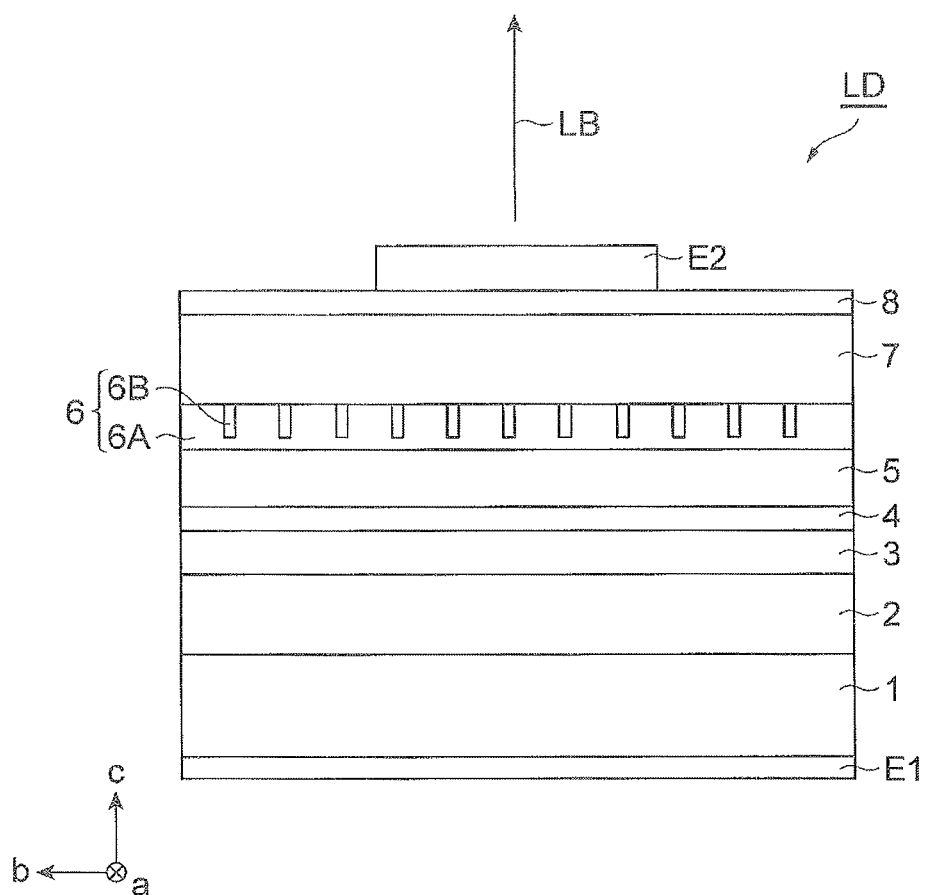
FIG. 4 is a view illustrating a longitudinal section structure of a laser element in the laser device.

FIG. 4 is a view illustrating a longitudinal section structure of a laser element in a laser device. FIG. 5 is a diagram illustrating component materials, conductive types, and thicknesses of laser elements.

The laser element LD includes an active layer 4, an upper cladding layer 7 and a lower cladding layer 2 sandwiching the active layer 4, and a photonic crystal layer 6 (refractive index modulation layer) provided between the upper cladding layer 7 (or the lower cladding layer 2 illustrated in FIG. 17) and the active layer 4. A light guide layer is intervened between the cladding layer and the active layer 4, and a contact layer 8 is formed on the upper cladding layer 7.

Specifically, a semiconductor substrate 1, the lower cladding layer 2, a lower light guide layer 3, the active layer 4, an upper light guide layer 5, the photonic crystal layer 6, the upper cladding layer 7, and the contact layer 8 are sequentially laminated in the laser element LD. A first electrode is provided on a back surface of the semiconductor substrate 1, and a second electrode E2 is provided so as to come into contact with an upper surface of the contact layer 8. When a forward bias voltage is applied between the first electrode E1 and the second electrode E2, light is emitted in the active layer 4 arranged between cladding layers. The light is modulated by the photonic crystal layer 6, and the laser beam LB is emitted in a direction (c axis and Z axis) perpendicular to a substrate surface.

Each element material is as illustrated in FIG. 5. The semiconductor substrate 1 includes GaAs. The lower cladding layer 2 includes AlGaAs. The lower light guide layer 3 includes AlGaAs. The active layer 4 includes a multiple quantum well structure MQW (a barrier layer: AlGaAs, a well layer: InGaAs). The upper light guide layer 5 includes AlGaAs on a lower layer and GaAs on an upper layer. In the photonic crystal layer 6, a basic layer 6A includes GaAs, and a different refractive index region 6B buried in the basic layer 6A (buried layer) includes AlGaAs. The upper cladding layer 7 includes AlGaAs. The contact layer includes GaAs. As illustrated in FIG. 5, impurities of a first conduction type (N type) and impurities of a second conductive type (P type) are added to each layer (impurity concentration is 1×$10^{17}$ to 1×$10^{21}$/$cm^3$), and a region in which any impurities are not intentionally added becomes intrinsic (I type). Impurity concentration of the I type is less than 1×$10^{15}$/$cm^3$.

Also, an energy band gap of a cladding layer is set so as to be larger than an energy band gap of a light guide layer. The energy band gap of the light guide layer is set so as to be larger than an energy band gap of a well layer of the active layer 4. In AlGaAs, an energy band gap and a refractive index can be easily changed by changing an Al composition ratio. In $Al_xGa_{1-x}As$, when a composition ratio X of Al having a relatively small atomic radius is decreased (increased), an energy band gap positively related to the composition ratio becomes small (large), and the energy band gap becomes small when In having a large atomic radius is mixed in GaAs to make InGaAs. Specifically, an Al composition ratio of a cladding layer is larger than an Al composition ratio of a light guide layer, and the Al composition ratio of the light guide layer is larger than an Al composition ratio of a barrier layer (AlGaAs) of an active layer. The Al composition ratio of the cladding layer is set to 0.2 to 0.5 and assumed to be 0.4 in the present example. The Al composition ratio of the barrier layer in the light guide layer and the active layer is set to 0.1 to 0.15 and assumed to be 0.1 in the present example.

Also, the thickness of each layer is as illustrated in FIG. 5. Numerical ranges in the figure indicate preferred values. Values in parentheses indicate optimum values in trial production.

FIG. 21 is a far-field image photo illustrating polarization state of a typical pattern beam obtained from a laser element.

FIG. 21(A) is a far-field image directly obtained from a laser element, and it indicates that a far-field image of a Gaussian distribution spot shape is obtained. FIGS. 21(B) and (C) illustrate far-field image photos taken through a polarized filter. In the case where a relative angle between a polarization angle of the laser element and a polarization direction of the polarization filter is 0° (B), as with the case where the polarized filter is not used (A), a beam pattern having a Gaussian distribution spot shape is observed. On the other hand, in the case where the relative angle with the polarization angle is 90° (C), the beam pattern becomes stripe, and transmitted light intensity is decreased to one severalth in comparison with the case where the relative angle is 0° (B). A nonlinear optical crystal converts a wavelength of basic wave polarized in a periodic polarization reversal direction and functions similar to the polarized filter. Therefore, when a polarization direction of a laser beam of the nonlinear optical crystal is arranged to the periodic polarization reversal direction, a wavelength conversion light obtained from the nonlinear optical crystal has a beam pattern having a Gaussian distribution spot shape corresponding to the case where a polarization direction of the laser element and a phase angle of the polarized filter is 0°.

Herein, the photonic crystal layer 6 includes the basic layer 6A including a first refractive index medium, and multiple different refractive index regions 6B including a second refractive index medium having a refractive index different from that of the first refractive index medium and arranged in the basic layer 6A. Also, a lattice interval of a photonic crystal in the laser element is arranged so that a lattice interval of a square lattice coincides with an effective laser wavelength of a laser emission wavelength divided by an effective refractive index of the element inside. A lattice interval of a triangle lattice is arranged so that a laser emission wavelength becomes a value divided by an effective refractive index of the element inside and multiplied by $(2/\sqrt{3})$. Hereinafter, details will be described.

Figure 6:
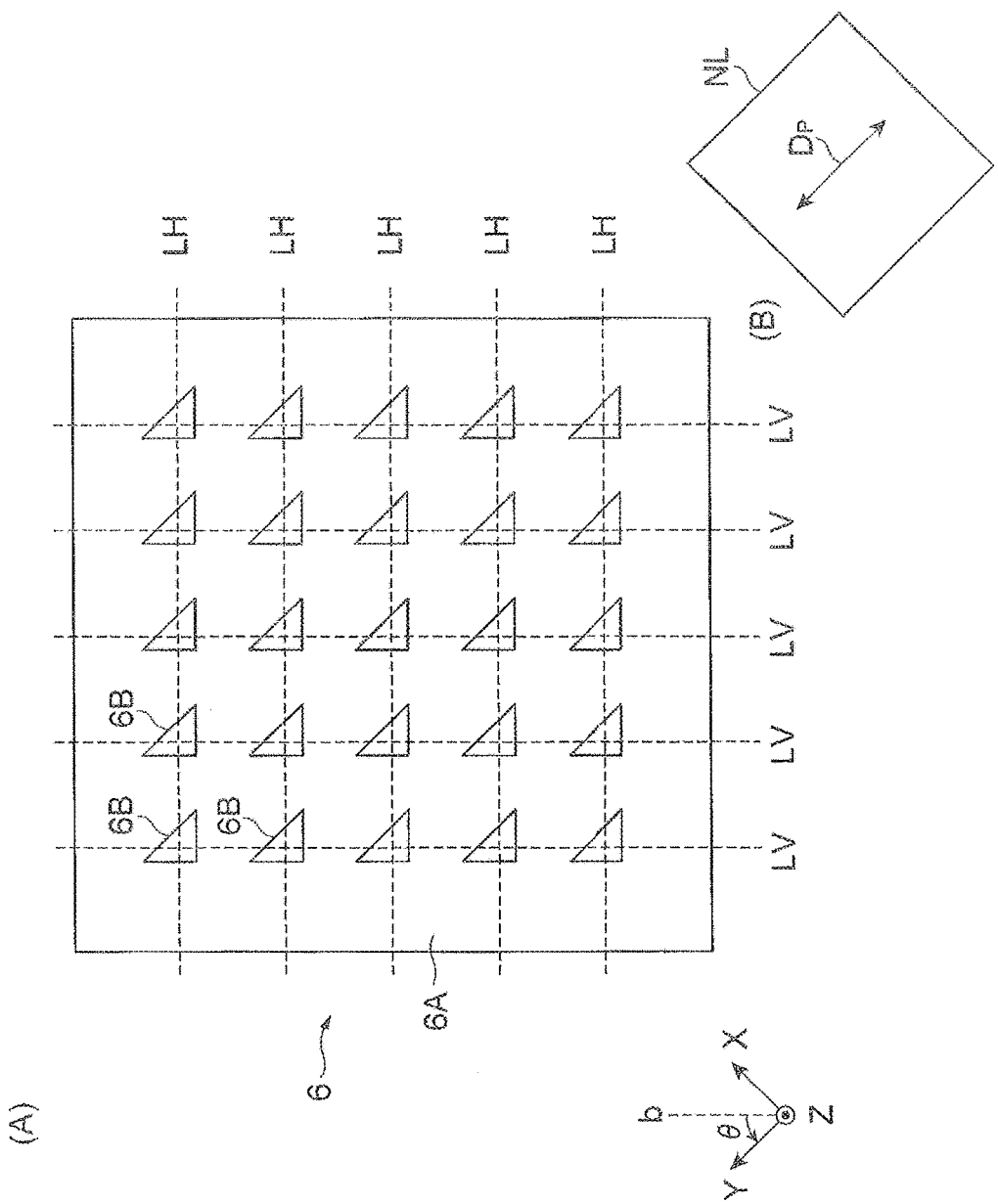
FIG. 6 are a plan view (A) of a photonic crystal layer (a first example) in a laser element, and a view (B) illustrating a direction of polarization in a nonlinear optical crystal.

FIG. 6 are a plan view (A) of the photonic crystal layer (a first example) in the laser element, and a view (B) illustrating a direction of polarization in the nonlinear optical crystal.

In FIG. 6, the case where an electromagnetic field in a photonic crystal is Mode A(FIG. 8) will be described. The multiple different refractive index regions 6B are arranged at a lattice point position in a square lattice (indicated by dotted lines) set on a main surface of the photonic crystal layer 6. A plane shape of each of the different refractive index regions 6B is set to a nearly isosceles right triangle. Two sides forming a right angle of the nearly isosceles right triangle extend along a longitudinal lattice line LV and a horizontal lattice line LH forming the square lattice.

Herein, a direction parallel to an oblique side of the nearly isosceles right triangle (Y axis: an axis in which b axis is rotated by θ: θ=45°) and a direction of polarization $D_P$ (Y axis) in a periodic polarization inversion, structure of the nonlinear optical crystal NL are the same.

A plane shape of the specified different refractive index region 6B does not become a shape mathematically strictly specified in actual manufacturing. Angles thereof are rounded, and each side might be slightly distorted. "Nearly" means that a specified shape may be slightly deformed as described above during manufacturing.

In the laser device according to the first example, when a laser beam emitted from a photonic crystal surface emitting laser element is incident on a nonlinear optical crystal NL having a periodic polarization inversion structure, a wavelength of the laser beam is converted by the nonlinear optical crystal NL, and the laser beam is emitted from the nonlinear optical crystal NL. The different refractive index region 6B in the photonic crystal layer 6 is arranged at a lattice point position of a square lattice. Also, in the case where a shape and a direction satisfy the above condition, a wavelength conversion light obtained from a nonlinear optical crystal has a beam pattern having a Gaussian distribution spot shape, and light intensity remarkably increases. This is because a polarization direction generated in the different refractive index region 6B coincides with the direction of polarization D in ModeA.

Figure 7:
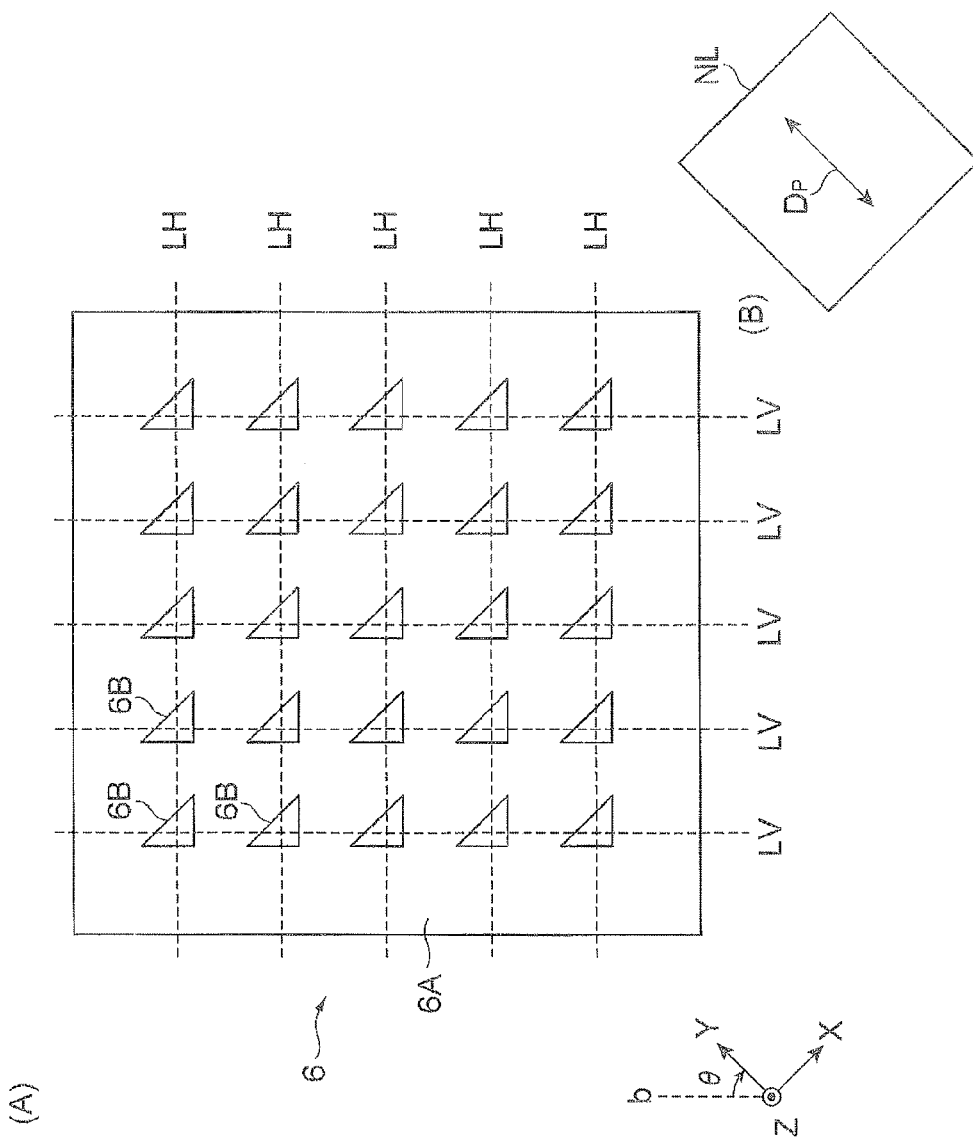
FIG. 7 are a plan view (A) of the photonic crystal layer (the first example) in the laser element, and a view (B) illustrating a direction of polarization of another state in the nonlinear optical crystal.

FIG. 7 are a plan view (A) of the photonic crystal layer (the first example) in the laser element, and a view (B) illustrating a direction of polarization of another state in the nonlinear optical crystal.

The case where an electromagnetic field in a photonic crystal becomes Mode A (FIG: 8) is described in FIGS. 6. The case of ModeB (FIG. 9) is described in FIG. 7.

As with FIG. 6, the multiple different refractive index regions 6B are arranged at a lattice point position in a square lattice (indicated by dotted lines) set on a main surface of the photonic crystal layer 6. A plane shape of each of the different refractive index regions 6B is set to a nearly isosceles right triangle. A polarization direction of the laser element and a polarization direction in the periodic polarization inversion structure are the same. Two sides forming a right angle of the nearly isosceles right triangle extend along a longitudinal lattice line LV and a horizontal lattice line LH forming the square lattice.

Herein, a direction perpendicular to an oblique side of the nearly isosceles right triangle (Y axis: an axis in which b axis is rotated by θ: θ=45°) and a direction of polarization $D_P$ (Y axis) in a periodic polarization inversion structure of the nonlinear optical crystal NL are the same.

Also in this case, In the laser device according to the first example, when a laser beam emitted from a photonic crystal surface emitting laser element is incident on a nonlinear optical crystal NL having a periodic polarization inversion structure, a wavelength of the laser beam is converted by the nonlinear optical crystal NL, and the laser beam is emitted from the nonlinear optical crystal NL. The different refractive index region 6B in the photonic crystal layer 6 is arranged at a lattice point position of a square lattice. Also, in the case where a shape and a direction satisfy the above condition, a wavelength conversion light obtained from a nonlinear optical crystal has a beam pattern having a Gaussian distribution spot shape, and light intensity remarkably increases. This is because a polarization direction generated in the different refractive index region 6B coincides with the direction of polarization $D_P$ in Mode B.

The ModeA and ModeB can be switched by changing a photonic crystal shape of a laser element and a gain wavelength of a semiconductor quantum well layer.

FIG. 8 are a view (A) illustrating an electromagnetic field on a two-dimensional plane of the photonic crystal layer in the laser element and a diagram (B) illustrating a polarization direction in a two-dimensional plane of the photonic crystal layer, in the ModeA indicated in Non-Patent Literature Opt. Exp. Vol. 19 (24) p24672.

Allows along a circumferential direction in FIG. 8(A) indicate a direction and intensity of an electric field. An electric field generated in the different refractive index region 6B having a small refractive index in a photonic crystal layer contributes to a polarization direction of an element, and therefore polarization in a direction parallel to an oblique side of a triangle is increased.

FIG. 8(B) illustrates the above polarization direction (indicated with a large arrow). Rx, Ry, Sx, and Sy in the coordinate system indicate axis forward directions of four directional basic standing waves generating in a photonic crystal surface. Also, each vector indicates a polarization direction of each standing wave and intensity thereof. When the above standing wave contributes to light emission in a direction vertical to a surface, a polarization direction as illustrated in the figure generates.

FIG. 9 are a view (A) illustrating an electromagnetic field on a two-dimensional plane of the photonic crystal layer in the laser element and a diagram (B) illustrating a polarization direction in a two-dimensional plane of the photonic crystal layer, in the ModeB indicated in Non-Patent Literature Opt. Exp. Vol, 19 (24) p24672.

Allows along a circumferential direction in FIG. 9(A) indicate a direction and intensity of an electric field. An electric field generated in the different refractive index region 6B having a small refractive index in a photonic crystal layer contributes to a polarization direction of an element, and therefore polarization in a direction vertical to an oblique side of a triangle is increased.

FIG. 9(B) illustrates the above polarization direction (indicated with a large arrow), Rx, Ry, Sx, and Sy in the coordinate system indicate axis forward directions of four directional basic standing waves generating in a photonic crystal surface. Also, each vector indicates a polarization direction of each standing wave and intensity thereof. When the above standing wave contributes to light emission in a direction vertical to a surface, a polarization direction as illustrated in the figure generates.

Figure 10:
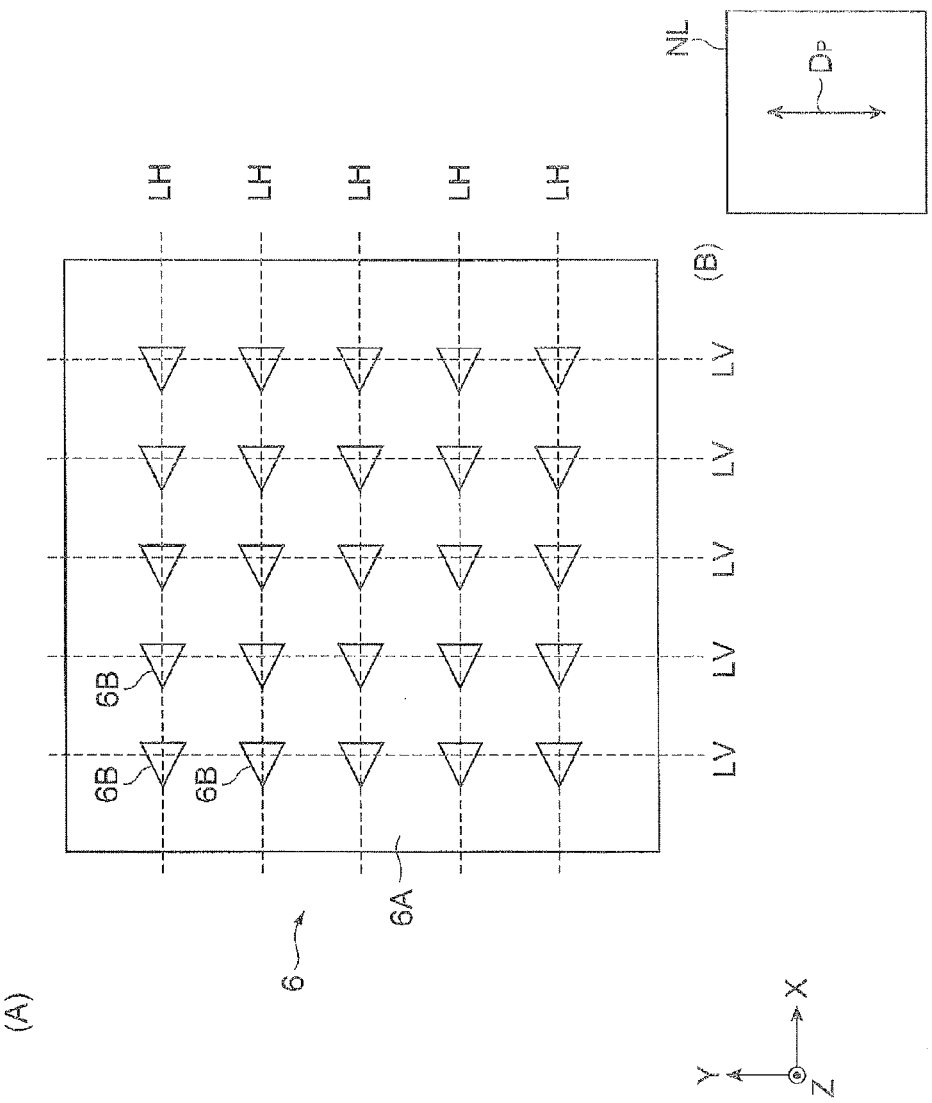
FIG. 10 are a plan view (A) of a photonic crystal layer (a second example) in a laser element, and a view (B) illustrating a direction of polarization in a nonlinear optical crystal.

FIG. 10 are a plan view (A) of the photonic crystal layer (the second example) in the laser element, and a view (B) illustrating a direction of polarization in the nonlinear optical crystal.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a square lattice (indicated by dotted lines) set on a main surface of the photonic crystal layer. A plane shape of each of the different refractive index regions 6B is set to a nearly equilateral triangle. A vertical line extending to a base from one of apexes of the nearly equilateral triangle extends along the longitudinal lattice line LV forming the square lattice. A direction of the base of the nearly equilateral triangle (Y axis=c axis: $\theta=0°$) and a direction of polarization $D_P$ (Y axis) in the periodic polarization inversion structure are the same.

In the laser device according to the second example, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, the different refractive index region 6B in the photonic crystal layer is arranged at a lattice point position of a square lattice. Also, in the case where a shape and a direction satisfy the above condition, a wavelength conversion light obtained from a nonlinear optical crystal has a beam pattern having a Gaussian distribution spot shape, and light intensity remarkably increases. This is because a polarization direction generated in the different refractive index region 6B coincides with the direction of polarization $D_P$.

Figure 11:
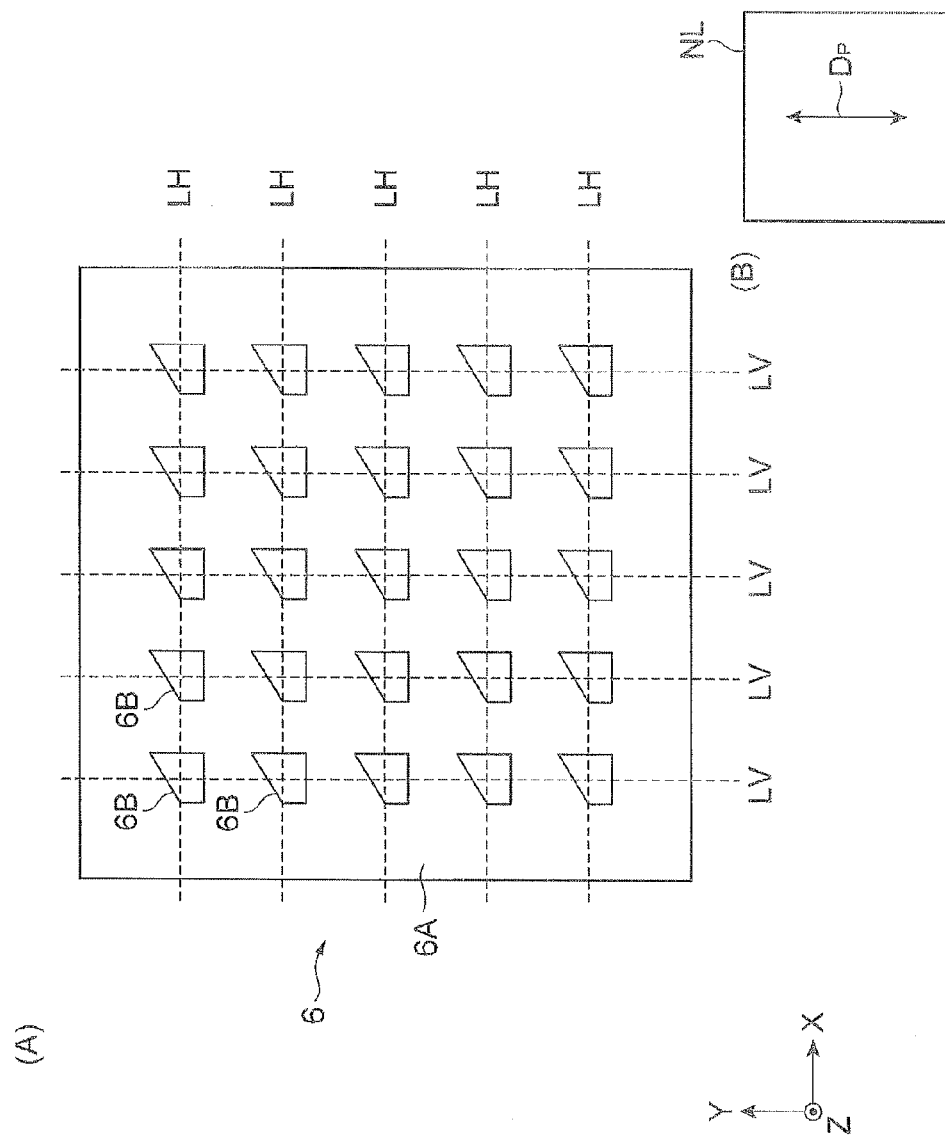
FIG. 11 are a plan view (A) of a photonic crystal layer (a third example) in a laser element, and a view (B) illustrating a direction of polarization in a nonlinear optical crystal.

FIG. 11 are a plan view (A) of the photonic crystal layer (the third example) in the laser element, and a view (B) illustrating a direction of polarization in the nonlinear optical crystal.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a square lattice (indicated by dotted lines) set on a main surface of the photonic crystal layer.

A plane shape of each of the different refractive index regions 6B is set to a nearly rectangular trapezoid. Two sides forming one of right angles of the nearly rectangular trapezoid extend along a longitudinal lattice line LV and a horizontal lattice line LH forming a square lattice. A direction (Y axis=c axis: $\theta=0°$) of a lower bottom (a long side is a lower bottom, and a short side is an upper bottom) of the nearly rectangular trapezoid and a direction of polarization $D_P$ (Y axis) in a periodic polarization inversion structure are the same.

in the third laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, the different refractive index region 6B in the photonic crystal layer is arranged at a lattice point position of a square lattice. Also, in the case where a shape and a direction satisfy the above condition, a wavelength conversion light obtained from a nonlinear optical crystal has a beam pattern having a Gaussian distribution spot shape, and light intensity remarkably increases. This is because a polarization direction generated in the different refractive index region 6B coincides with the direction of polarization $D_P$.

Figure 12:
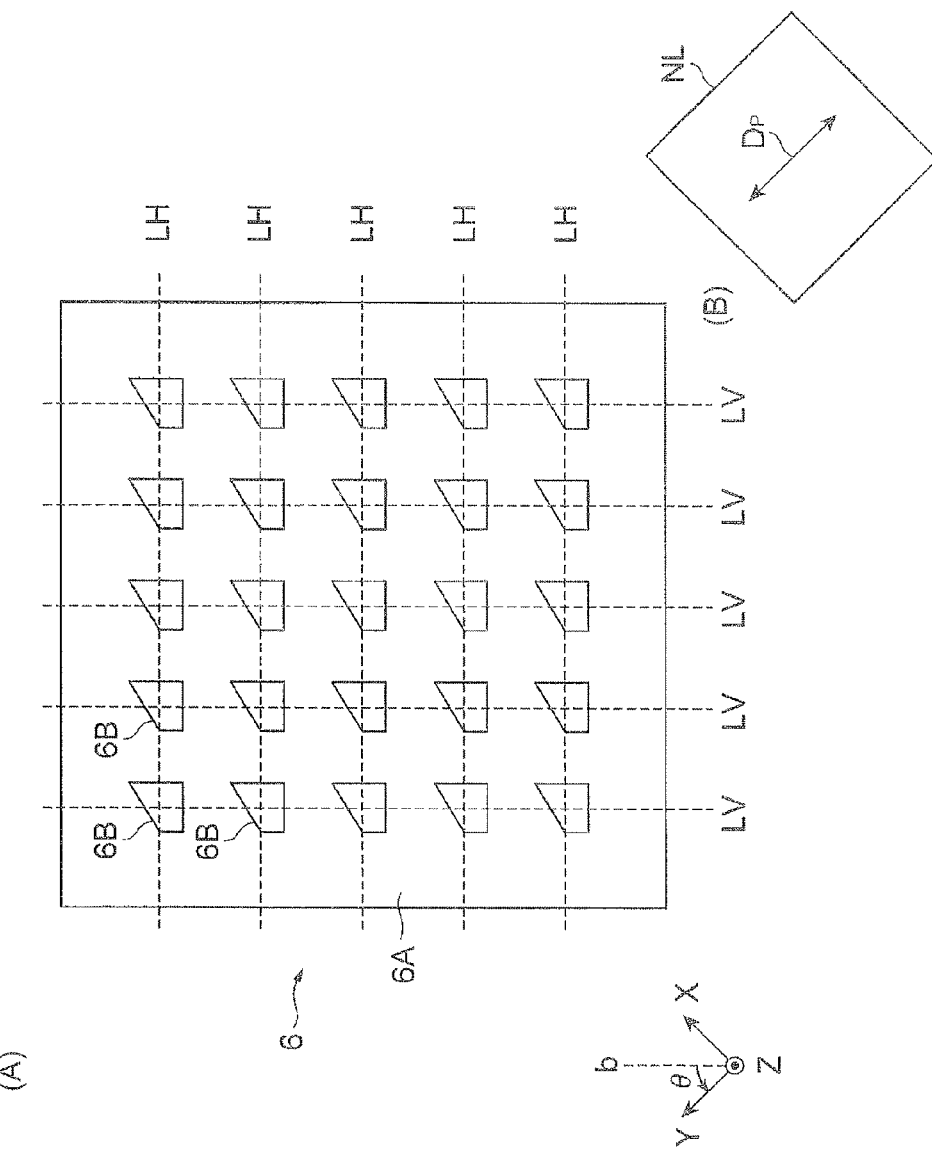
FIG. 12 are a plan view (A) of the photonic crystal layer (the third example) in the laser element, and a view (B) illustrating a direction of polarization of another state in the nonlinear optical crystal.

FIG. 12 are a plan view (A) of the photonic crystal layer (the third example) in the laser element, and a view (B) illustrating a direction of polarization of another state in the nonlinear optical crystal.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a square lattice (indicated by dotted lines) set on a main surface of the photonic crystal layer.

A plane shape of each of the different refractive index regions 6B is set to a nearly rectangular trapezoid. Two sides forming one of right angles of the nearly rectangular trapezoid extend along a longitudinal lattice line LV and a horizontal lattice line LH forming a square lattice. A direction (Y axis=c axis: $\theta=45°$) forming an angle of 45° to the lower bottom of the nearly rectangular trapezoid and a direction of polarization $D_P$ (Y axis) in the periodic polarization inversion structure are the same. For a reason similar to the above, a wavelength conversion light obtained from a nonlinear optical crystal has a beam pattern having a Gaussian distribution spot shape, and light intensity remarkably increases.

The modes of FIGS. 11 and 12 can be switched by changing a photonic crystal shape of a laser element and a gain wavelength of a semiconductor quantum well layer.

Figure 13:
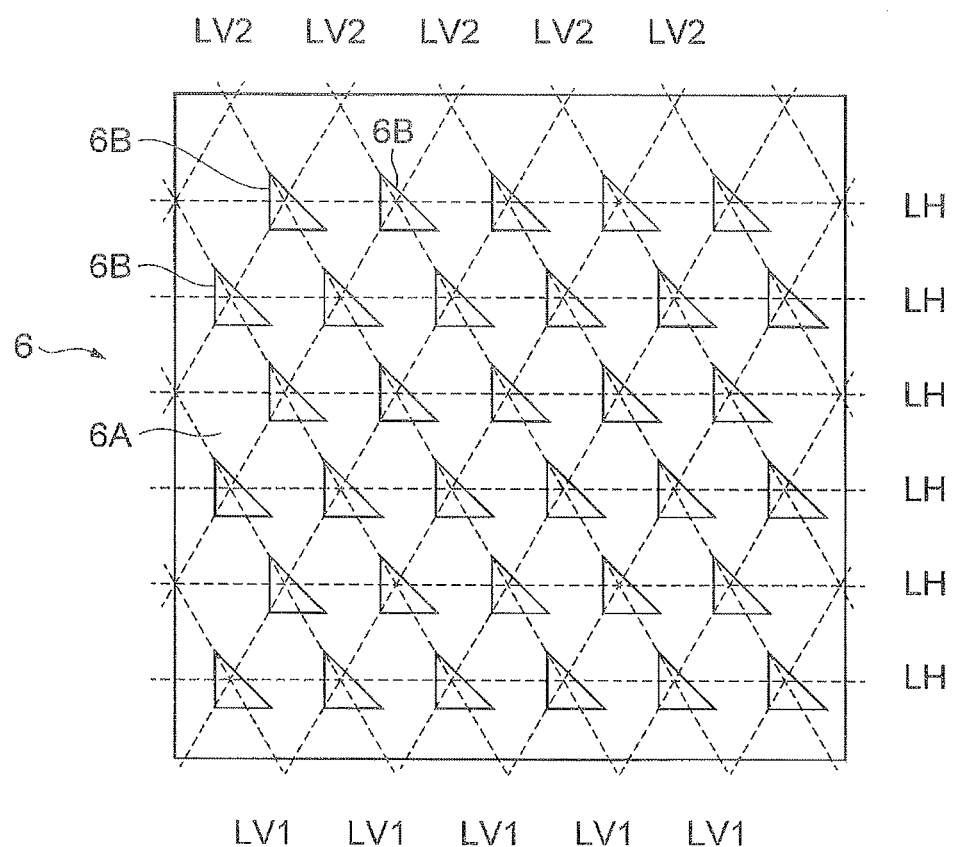
FIG. 13 is a plane view of the photonic crystal layer (a fourth example) in the laser element.

FIG. 13 is a plane view (XY plane) of the photonic crystal layer (the fourth example) in the laser element.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a triangle lattice (indicated by dotted lines) set on a main surface of the photonic crystal layer.

A plane shape of each of the different refractive index regions 6B is set to a nearly isosceles right triangle. One side forming a right angle of the nearly isosceles right triangle extends along one lattice line LH forming a triangle lattice. A lattice line LV1 extending from upper right to lower left is indicated as a lattice line LV2 extending from upper left to lower right. Each lattice forms an equilateral triangle.

In the fourth laser device, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a triangle lattice. In the case where a polarization direction of a laser element coincides with a periodic polarization inversion direction of a nonlinear optical crystal, a wavelength conversion light has a beam pattern having a Gaussian distribution spot shape, and light intensity remarkably increases.

Figure 14:
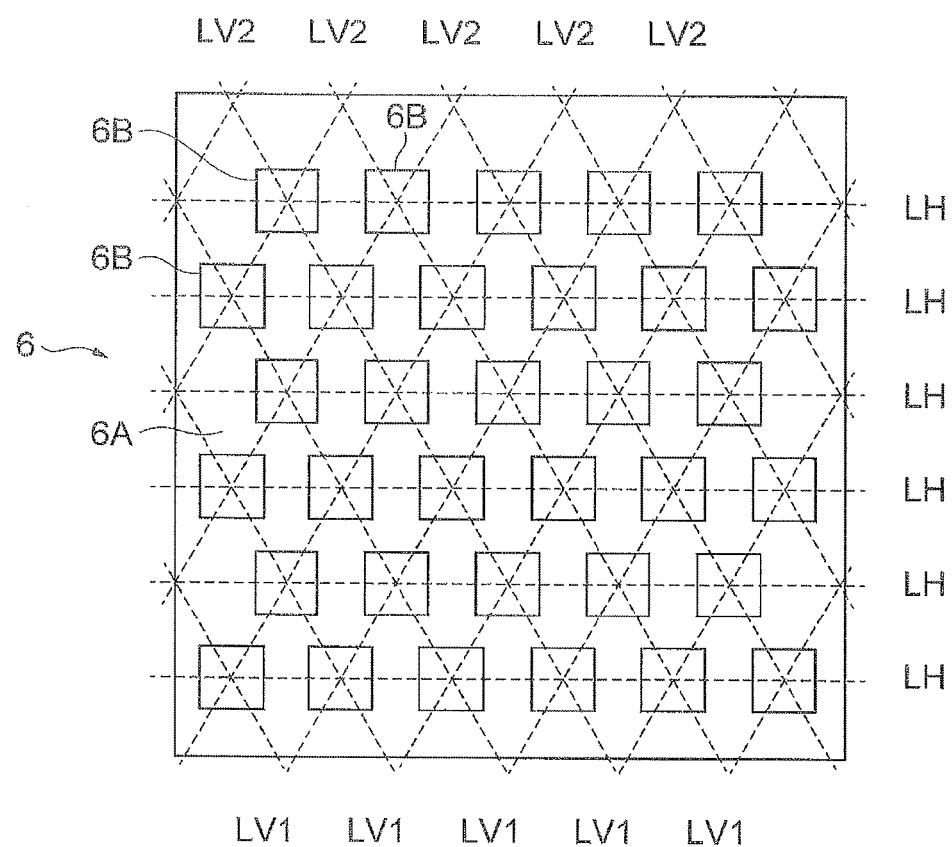
FIG. 14 is a plane view of a photonic crystal layer (a fifth example) in a laser element.

FIG. 14 is a plane view (XY plane) of the photonic crystal layer (the fifth example) in the laser element.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a triangle lattice (indicated by dotted lines) set on a main surface of the photonic crystal layer.

A plane shape of each of the different refractive index regions 6B is set to a nearly square. One side of the square extends along a horizontal lattice line LH forming a triangle lattice. A lattice line LV1 extending from upper right to lower left is indicated as a lattice line LV2 extending from upper left to lower right. Each lattice forms an equilateral triangle.

In the laser device according to the fifth example, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a triangle lattice. In the case where a polarization direction of a laser element coincides with a periodic polarization inversion direction of a nonlinear optical crystal, a wavelength conversion light has a beam pattern having a Gaussian distribution spot shape, and light intensity remarkably increases.

Figure 15:
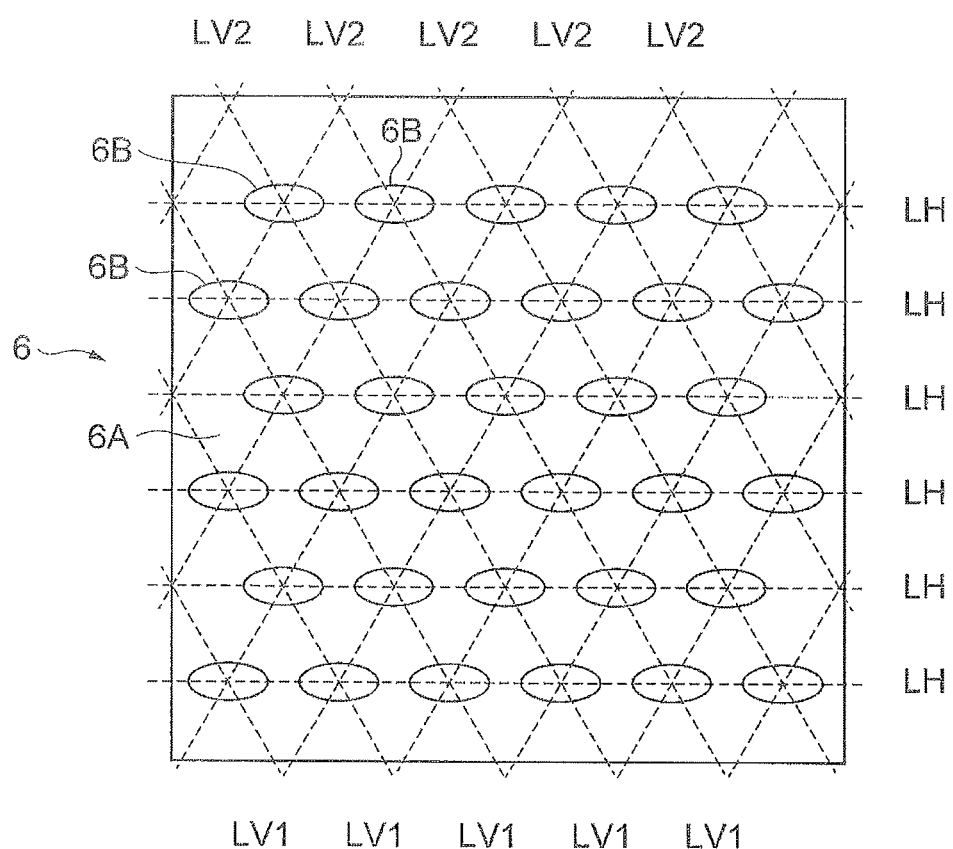
FIG. 15 is a plane view of a photonic crystal layer (a sixth example) in a laser element.

FIG. 15 is a plane view (XY plane) of the photonic crystal layer (the sixth example) in the laser element.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a triangle lattice (indicated by dotted lines) set on a main surface of the photonic crystal layer.

A plane shape of each of the different refractive index regions 6B is set to nearly oval (not a complete circle) of which flattening is larger than 0. A long axis of the nearly oval extends along a horizontal lattice line LH forming a triangle lattice. A lattice line LV1 extending from upper right to lower left is indicated as a lattice line LV2 extending from upper left to lower right. Each lattice forms an equilateral triangle.

In the laser device according to the sixth example, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region 6B in a photonic crystal layer 6 is arranged at a lattice point position of a triangle lattice. In the case where a polarization direction of a laser element coincides with a periodic polarization inversion direction of a nonlinear optical crystal, a wavelength conversion light has a beam pattern having a Gaussian distribution spot shape, and light intensity remarkably increases.

Figure 16:
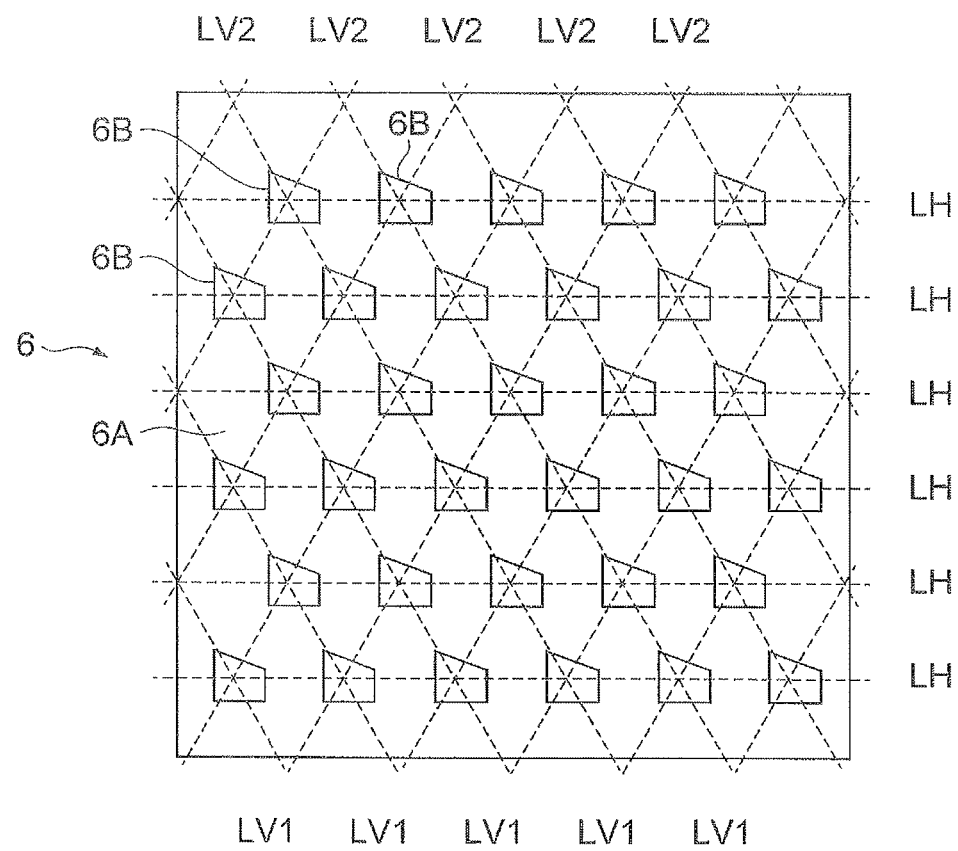
FIG. 16 is a plane view of a photonic crystal layer (a seventh example) in a laser element.

FIG. 16 is a plane view (XY plane) of the photonic crystal layer (the seventh example) in the laser element.

The photonic crystal layer 6 includes the basic layer 6A including a first refractive index medium and the multiple different refractive index regions 6B including a second refractive index medium having a refractive index different from that of the first refractive index medium and arranged in the basic layer 6A. The multiple different refractive index regions 6B are arranged at a lattice point position in a triangle lattice (indicated by dotted lines) set on a main surface of the photonic crystal layer.

A plane shape of each of the different refractive index regions 6B is set to a nearly rectangular trapezoid. One side specifying the height of the nearly rectangular trapezoid extends along a horizontal lattice line LH forming a triangle lattice. A lattice line LV1 extending from upper right to lower left is indicated as a lattice line LV2 extending from upper left to lower right. Each lattice forms an equilateral triangle.

In the laser device according to the seventh example, when a laser beam emitted from a photonic crystal surface emitting laser element is incident on a nonlinear optical crystal having a periodic polarization inversion structure, a wavelength of the laser beam is converted by the nonlinear optical crystal, and the laser beam is emitted from the nonlinear optical crystal. Herein, a different refractive index region in a photonic crystal layer is arranged at a lattice point position of a triangle lattice. In the case where a polarization direction of a laser element coincides with a periodic polarization inversion direction of a nonlinear optical crystal, a wavelength conversion light has a beam pattern having a Gaussian distribution spot shape, and light intensity remarkably increases.

Figure 17:
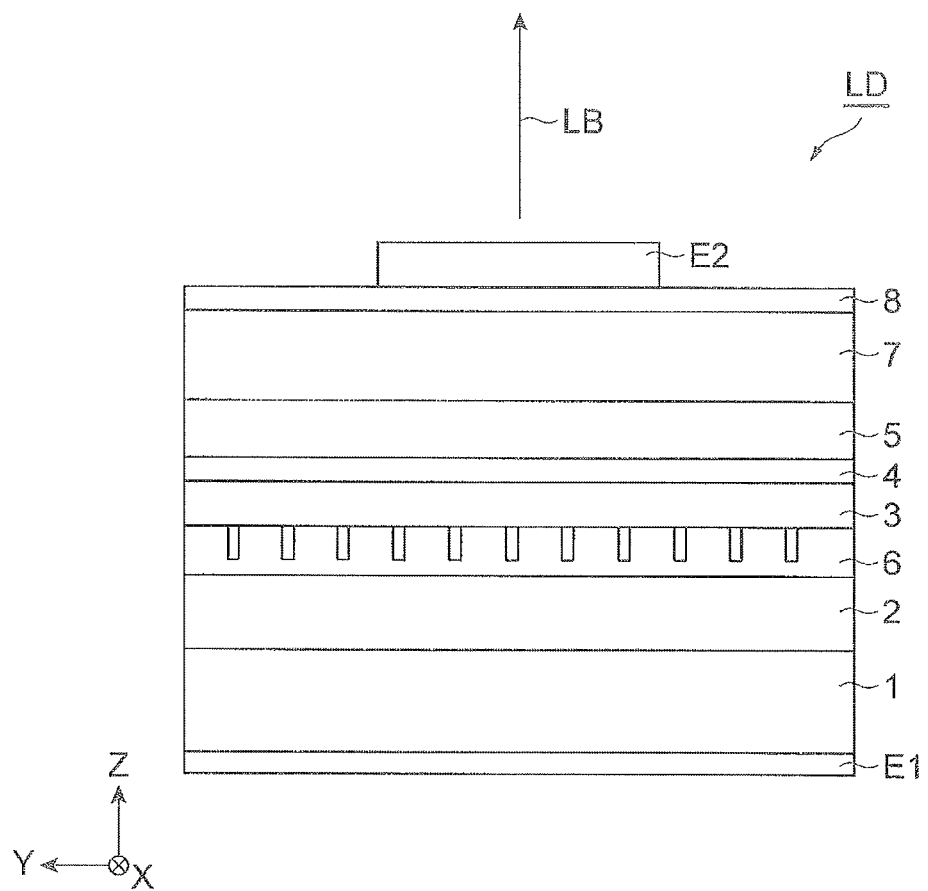
FIG. 17 is a view illustrating a longitudinal section structure of a laser element in a laser device.

FIG. 17 is a view illustrating a longitudinal section structure of the laser element in the laser device.

The semiconductor substrate 1, the lower cladding layer 2, the lower light guide layer 3, the photonic crystal layer 6, the active layer 4, an upper light guide layer 5, the upper cladding layer 7, and the contact layer 8 are sequentially laminated in the laser element LD. A first electrode is provided on a back surface of the semiconductor substrate 1, and a second electrode E2 is provided so as to come into contact with an upper surface of the contact layer 8. A position of the photonic crystal layer 6 is different from the position illustrated in FIG. 4. A material, a structure and a function are same as those illustrated in FIG. 4. Also in the laser element, when a forward bias voltage is applied between the first electrode E1 and the second electrode E2, light is emitted in the active layer 4 arranged between cladding layers. The light is modulated by the photonic crystal layer 6, and the laser beam LB is emitted in a direction (c axis and Z axis) perpendicular to a substrate surface.

Figure 18:
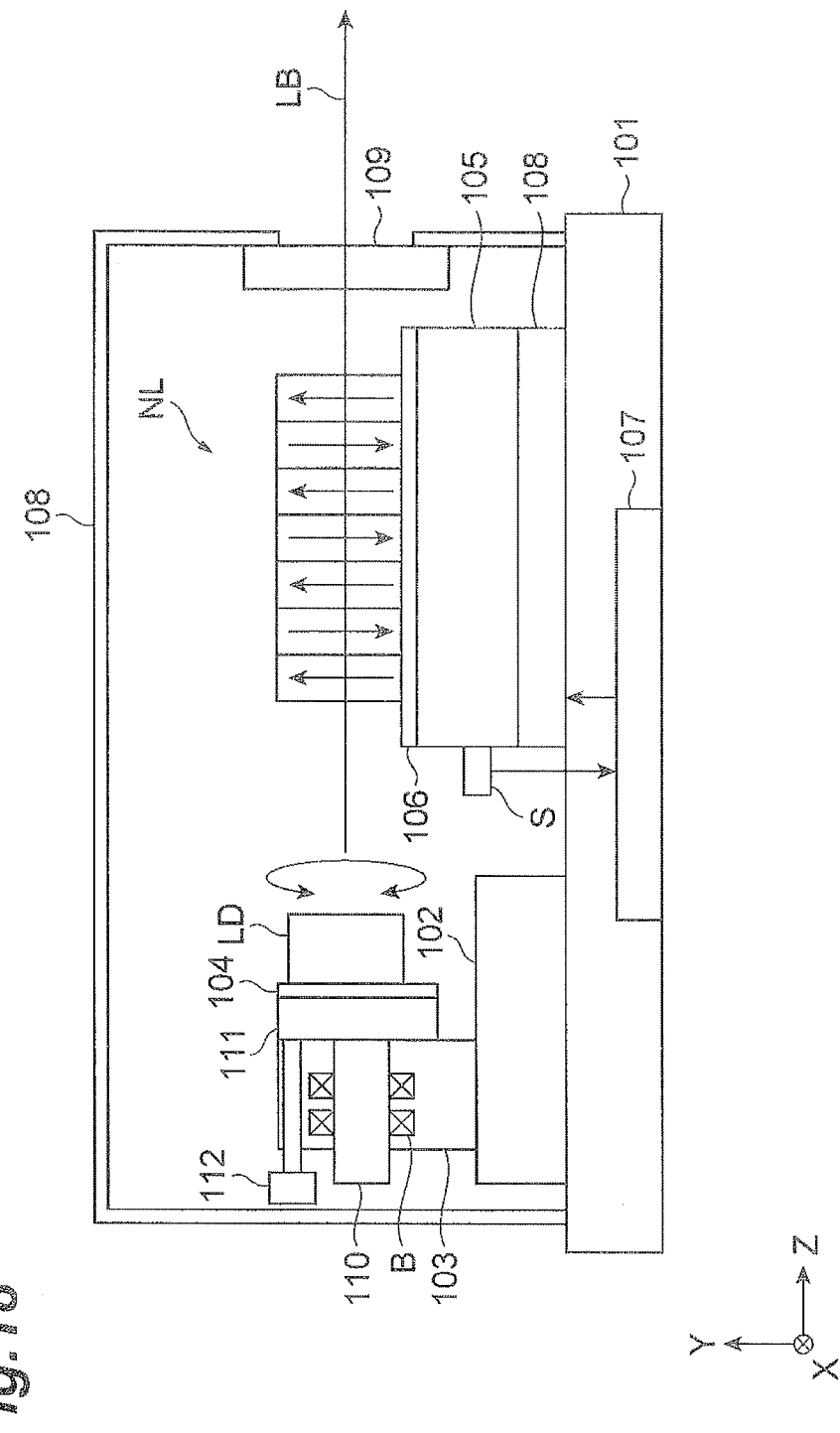
FIG. 18 is a view illustrating a longitudinal section structure of a laser device.

FIG. 18 is a view illustrating a longitudinal section structure of the laser device.

In comparison with the laser device illustrated in FIG. 1, this laser device is different from that a heat sink 105 does not include a V-groove, the support member 103 rotatably supports a rotation axis 110 in a Z axis direction, a ball bearing B is intervened between the rotation axis 110 and the support member 103, a sub-support member 111 is fixed to a tip of the rotation axis 110, and the laser element LD is fixed on the sub-support member 111 through the adhesive 104. A rotation prevention pin mechanism 112 is provided to the support member 103. When the pin mechanism 112 is inserted, it comes into contact with a rear surface of the sub-support member 111, and a rotation position of the laser element LD is fixed. Other configuration is same as the configuration illustrated in FIG. 1.

According to the configuration, a relative rotation angle θ between the laser element LD and the nonlinear optical crystal NL can be adjusted.

FIGS. 19 are graphs illustrating the relation between a wavelength and intensity in the laser device.

A center wavelength of a laser beam emitted from the laser element LD is 1068 nm (FIG. 19(A)). In this case, the center wavelength of a laser beam emitted from the nonlinear optical crystal NL is 534 nm (FIG. 19(B)). A high-harmonic of which frequency is twice (a wavelength is ½) can be obtained.

Figure 20:
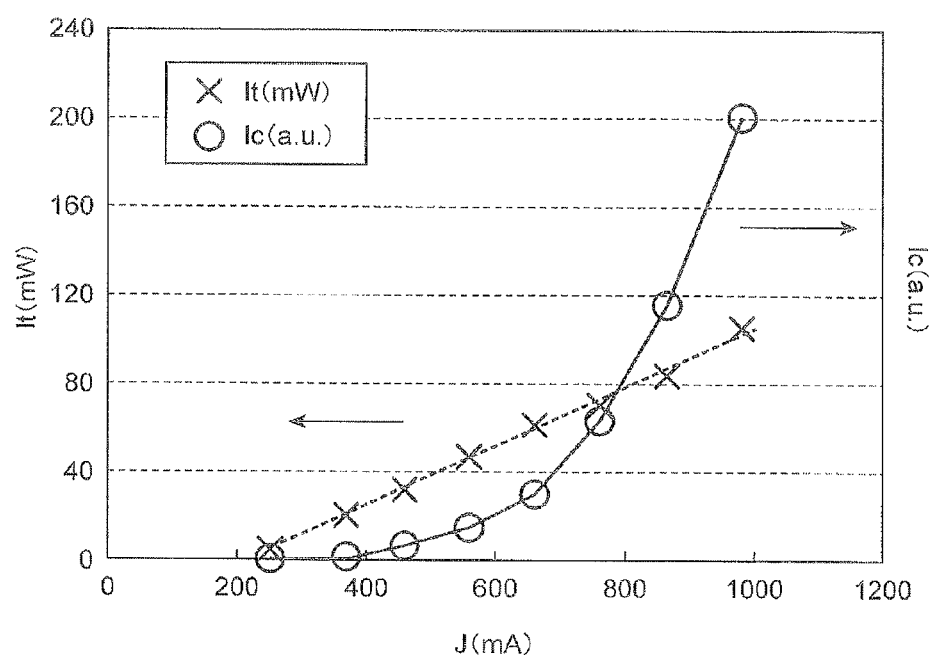
FIG. 20 is a diagram illustrating the relation among an injection current J (mA), whole light output It (mW), and wavelength conversion output Ic (a.u.).

FIG. 20 is a diagram illustrating the relation among an injection current J (mA) to a laser element, whole light output It (mW) after passing the nonlinear optical crystal NL, and wavelength conversion light output Ic (a.u.).

When the injection current J is increased, the whole light output It is increased while maintaining a high linearity by reflecting the light output of the laser element. On the other hand, it has been confirmed that a wavelength conversion light output Ic output from the nonlinear optical crystal has increased nonlinearly with respect to the injection current J. It corresponds that wavelength conversion efficiency of the nonlinear optical crystal NL is proportional to the square of a light density of an incident basic wave laser beam.

Dimensions applied in the above experiment are as follows: A nonlinear optical crystal: MgO dope $LiMbO_3$ (PPLN), L2=35 mm, L3=7 μm, W2=0.5 mm, a dimension of an isosceles right triangle forming a different refractive index region: 240 nm (a length of equilateral sides), an interval of a lattice line of a square lattice: 320 nm In the present invention, a condenser or a collimator lens may be provided between a laser element and a nonlinear optical crystal. A photonic crystal unit 6B of the laser element may be completely embedded by a semiconductor material or may be a space. Also, although a nonlinear optical crystal having a polarization inversion structure is illustrated, nonlinear optical crystals which do not have the polarization inversion structure, such as $KTiOPO_4$ (KTP), $β-Ba_2B_2O_3$ (BBO), or $LiB_2O_5$ (LBO), may be used. At this time, a polarization direction of a laser element is matched to a crystal surface having the highest wavelength conversion efficiency of the nonlinear optical crystal. The above laser element emits a laser beam by independently oscillating without a nonlinear optical crystal.

In the above-described structure, materials, film thickness, and layers are freely configured if the above configuration includes the active layer 4 and the photonic crystal layer 6. When the laser element is manufactured, a metal organic vapor phase deposition (MOCVD) method is used in each semiconductor compound. A crystal growth is performed on a surface (001) of the semiconductor substrate 1, but it is not limited thereto. Also, when the laser element, in which the above-described AlGaAs is used, is manufactured, a growth temperature of AlGaAs is 500 to 850° C., and the temperature has been set to 550 to 700° C. in the experiment. The following materials are used during growth: trimethylaluminum (TMA) as an Al material, trimethylgallium (TMG) and triethylgallium (TEG) as a gallium material, arsine ($AsH_3$) as an As material, disilane ($Si_2H_6$) as a material for N-type impurities, and diethyl zinc (DEZn) as a material for a P-type impurities. TMG and arsine are used for growth of GaAs, but TMA is not used. InGaAs is manufactured by using TMG, trimethylindium (TMI), and arsine. As necessary, an insulation film covering a substrate surface may be formed by using a plasma CVD (PCVD) method.

Specifically, on the N-type semiconductor substrate (GaAs) 1, the above-described laser element performs epitaxial growth by using the MOCVD (metal organic vapor phase deposition) method sequentially to the N-type cladding layer (AlGaAs) 2, the guide layer (AlGaAs) 3, the multiple quantum well structure (InGaAs/AlGaAs) 4, the light guide layer (GaAs/AaGaAs) 5, and the basic layer (GaAs) 6A to be a photonic crystal layer. Next, by using the PCVD (plasma CVD) method, a SiN layer is formed on the basic layer 6A, and a resist is formed on the SiN layer.

Next, a two dimensional macro patter is drawn on the resist by an electron beam drawing apparatus and is formed on the resist by developing the pattern. Then, by using the resist as a mask, the two dimensional macro pattern having nearly 100 to 300 nm in depth by dry etching is transferred on the basic layer 6A, a hole is formed, and the resist and the SiN layer are removed. Next, the upper cladding layer (AlGaAs) 7, the contact layer (GaAs) 8 are sequentially formed by MOCVD, and the first and second electrodes are formed by forming an appropriate electrode material on upper and lower surfaces of the substrate by an evaporation method. As necessary, an insulation film can be formed by the PCVD (plasma CVD) method on the upper and lower surfaces of the substrate.

In the case where a photonic crystal layer is provided at a bottom portion of an active layer, the photonic crystal layer may be formed on a lower cladding layer before the active layer and a lower light guide layer are formed.

In the case of a square lattice of a lattice interval a, when unit vectors of an orthogonal coordinate are assumed to be x and y, basic parallel vectors are assumed to be $a_1$=ax, $a_2$=ay. A reciprocal lattice basic vectors with respect to the parallel vectors a, $a_2$ are assumed to be $b_1$=(2π/a)y, $b_2$=(2π/a)x. In the case where a wavevector in an energy hand gap of a photonic crystal is assumed to be k=$nb_1$+$mb_2$(n and in are any integer), a wavenumber k becomes a Γ point, and a resonance mode (standing wave in an XY plane) in which the lattice interval a is equal to the wave length λ can be obtained. A frequency of the Mode A is the lowest in resonance modes. A frequency of the Mode B is the next lowest.

A shape obtained by performing Fourier transform to an in-plane electromagnetic field (in-plane phase distribution of a point light source) of standing wave in the above-described photonic crystal layer (phase modulation layer) is a Gaussian distribution spot shape (spot). A refractive index of the basic layer 6A is preferably 3.0 to 3.5. A refractive index of the different refractive index region 6B is preferably 1.0 to 3.4. A polarization direction of a laser beam is likely to be along a direction parallel to or vertical to a longitudinal direction of a hole shape in a plane view.

REFERENCE SIGNS LIST

6A . . . base layer, 6B . . . different refractive index region, NL . . . nonlinear optical crystal

The invention claimed is:

1. A laser device, comprising a nonlinear optical crystal having a periodic polarization inversion structure in which a laser beam emitted from a photonic crystal surface emitting laser element is made incident,
wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium, and
multiple different refractive index regions including a second refractive index medium having a refractive index different from that of the first refractive index medium and arranged in the basic layer, and
the multiple different refractive index regions are arranged at a lattice point position in a square lattice set on a main surface of the photonic crystal layer,
wherein a plane shape of each of the different refractive index regions is set to a nearly isosceles right triangle,
two sides forming a right angle of the nearly isosceles right triangle extends along a longitudinal lattice line and a horizontal lattice line forming the square lattice, and
a direction parallel to or vertical to an oblique side of the nearly isosceles right triangle and a direction of polarization in the periodic polarization inversion structure are the same.

2. A laser device, comprising a nonlinear optical crystal having a periodic polarization inversion structure in which a laser beam emitted from a photonic crystal surface emitting laser element is made incident,
wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium, and
multiple different refractive index regions including a second refractive index medium having a refractive index different from that of the first refractive index medium and arranged in the basic layer, and
the multiple different refractive index regions are arranged at a lattice point position in a square lattice set on a main surface of the photonic crystal layer,
wherein a plane shape of each of the different refractive index regions is set to a nearly equilateral triangle,
a vertical line extending to a base from one of apexes of the nearly equilateral triangle extends along a longitudinal lattice line forming the square lattice, and
a direction of the base of the nearly equilateral triangle and a direction of polarization in the periodic polarization inversion structure are the same.

3. A laser device, comprising a nonlinear optical crystal having a periodic polarization inversion structure in which a laser beam emitted from a photonic crystal surface emitting laser element is made incident,
wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium, and
multiple different refractive index regions including a second refractive index medium having a refractive index different from that of the first refractive index medium and arranged in the basic layer, and
the multiple different refractive index regions are arranged at a lattice point position in a square lattice set on a main surface of the photonic crystal layer,
wherein a plane shape of each of the different refractive index regions is set to a nearly rectangular trapezoid,
two sides forming one of right angles of the nearly rectangular trapezoid extend along a longitudinal lattice line and a horizontal lattice line forming the square lattice, and
a direction of a lower bottom of the nearly rectangular trapezoid or a direction forming an angle of 45° to the lower bottom and a direction of polarization in the periodic polarization inversion structure are the same.

4. A laser device, comprising a nonlinear optical crystal having a periodic polarization inversion structure in which a laser beam emitted from a photonic crystal surface emitting laser element is made incident,
wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium, and
multiple different refractive index regions including a second refractive index medium having a refractive index different from that of the first refractive index medium and arranged in the basic layer, and
the multiple different refractive index regions are arranged at a lattice point position in a triangle lattice set on a main surface of the photonic crystal layer,
wherein a plane shape of each of the different refractive index regions is set to a nearly isosceles right triangle, and
a polarization direction of the photonic crystal surface emitting laser element and a direction of polarization in the periodic polarization inversion structure are the same, and
wherein the photonic crystal surface emitting laser element emits a laser beam by independently oscillating without a nonlinear optical crystal.

5. A laser device, comprising a nonlinear optical crystal having a periodic polarization inversion structure in which a laser beam emitted from a photonic crystal surface emitting laser element is made incident, wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium; and
multiple different refractive index regions including a second refractive index medium having a refractive index different from that of the first refractive index medium and arranged in the basic layer, and
the multiple different refractive index regions are arranged at a lattice point position in a triangle lattice set on a main surface of the photonic crystal layer,
wherein a plane shape of each of the different refractive index regions is set to a nearly square, and
a polarization direction of the photonic crystal surface emitting laser element and a direction of polarization in the periodic polarization inversion structure are the same, and
wherein the photonic crystal surface emitting laser element emits a laser beam by independently oscillating without a nonlinear optical crystal.

6. A laser device, comprising a nonlinear optical crystal having a periodic polarization inversion structure in which a laser beam emitted from a photonic crystal surface emitting laser element is made incident,
wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium; and
multiple different refractive index regions including a second refractive index medium having a refractive index different from that of the first refractive index medium and arranged in the basic layer, and
the multiple different refractive index regions are arranged at a lattice point position in a triangle lattice set on a main surface of the photonic crystal layer,
wherein a plane shape of each of the different refractive index regions is set to a nearly oval of which flattening is larger than 0, and
a polarization direction of the photonic crystal surface emitting laser element and a direction of polarization in the periodic polarization inversion structure are the same, and
wherein the photonic crystal surface emitting laser element emits a laser beam by independently oscillating without a nonlinear optical crystal.

7. A laser device, comprising a nonlinear optical crystal having a periodic polarization inversion structure in which a laser beam emitted from a photonic crystal surface emitting laser element is made incident,
wherein the photonic crystal surface emitting laser element includes
an active layer,
upper and lower cladding layers sandwiching the active layer, and
a photonic crystal layer provided between the upper or lower cladding layer and the active layer,
the photonic crystal layer includes
a base layer including a first refractive index medium; and
multiple different refractive index regions including a second refractive index medium having a refractive index different from that of the first refractive index medium and arranged in the basic layer, and
the multiple different refractive index regions are arranged at a lattice point position in a triangle lattice set on a main surface of the photonic crystal layer,
wherein a plane shape of each of the different refractive index regions is set to a nearly rectangular trapezoid, and
a polarization direction of the photonic crystal surface emitting laser element and a direction of polarization in the periodic polarization inversion structure are the same, and
wherein the photonic crystal surface emitting laser element emits a laser beam by independently oscillating without a nonlinear optical crystal.

* * * * *